United States Patent
You

(10) Patent No.: US 12,520,673 B2
(45) Date of Patent: Jan. 6, 2026

(54) DISPLAY APPARATUS AND METHOD OF MANUFACTURING THE SAME

(71) Applicant: Samsung Display Co., Ltd., Yongin-Si (KR)

(72) Inventor: Chungi You, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/355,100

(22) Filed: Jun. 22, 2021

(65) Prior Publication Data

US 2022/0216287 A1 Jul. 7, 2022

(30) Foreign Application Priority Data

Jan. 5, 2021 (KR) .................. 10-2021-0000985

(51) Int. Cl.
| | |
|---|---|
| *H01L 27/32* | (2006.01) |
| *H10K 59/124* | (2023.01) |
| *H10K 59/126* | (2023.01) |
| *H10K 71/40* | (2023.01) |
| *H10K 59/12* | (2023.01) |
| *H10K 59/65* | (2023.01) |

(52) U.S. Cl.
CPC ......... *H10K 59/124* (2023.02); *H10K 59/126* (2023.02); *H10K 71/421* (2023.02); *H10K 59/1201* (2023.02); *H10K 59/65* (2023.02)

(58) Field of Classification Search
CPC . H01L 27/3272; H01L 27/3258; H01L 51/56; H10K 59/124; H10K 59/126; H10K 59/1201; H10K 71/00

USPC .......................................................... 257/72
See application file for complete search history.

(56) References Cited

U.S. PATENT DOCUMENTS

| | | | |
|---|---|---|---|
| 10,840,317 B2 | 11/2020 | Oh et al. | |
| 11,374,200 B2 | 6/2022 | Seon et al. | |
| 11,437,458 B2 | 9/2022 | Chung et al. | |
| 2005/0145861 A1* | 7/2005 | Kawakami | H10K 59/123 257/88 |
| 2007/0178391 A1 | 8/2007 | Kim et al. | |
| 2009/0309493 A1* | 12/2009 | Seo | H10K 59/131 313/506 |
| 2011/0147770 A1* | 6/2011 | Hwang | H01L 27/326 257/89 |

(Continued)

FOREIGN PATENT DOCUMENTS

| | | |
|---|---|---|
| CN | 110649180 A | 1/2020 |
| CN | 111276055 A | 6/2020 |

(Continued)

OTHER PUBLICATIONS

English Machine Translation of CN 111276055. (Year: 2020).*

*Primary Examiner* — Dzung Tran
(74) *Attorney, Agent, or Firm* — Innovation Counsel LLP

(57) ABSTRACT

A display apparatus includes a substrate, display elements overlapping the substrate and spaced from each other, and an insulating layer arranged between the substrate and the elements. The insulating layer may include a protrusion and an opening. The opening is positioned between the display elements in a plan view of the display apparatus. An edge of the opening includes two convex portions. The protrusion is positioned between the two convex portions and protrudes toward an inner part of the opening.

7 Claims, 20 Drawing Sheets

(56) References Cited

U.S. PATENT DOCUMENTS

| | | | |
|---|---|---|---|
| 2015/0187800 A1* | 7/2015 | Park | H01L 27/1225 |
| | | | 257/43 |
| 2017/0053971 A1* | 2/2017 | Sato | H01L 51/5209 |
| 2017/0221982 A1* | 8/2017 | Park | H01L 27/3293 |
| 2017/0309651 A1* | 10/2017 | Kim | G02F 1/1345 |
| 2020/0105844 A1* | 4/2020 | Wang | H10K 59/126 |
| 2021/0028262 A1* | 1/2021 | Tanaka | H10K 50/865 |

FOREIGN PATENT DOCUMENTS

| | | |
|---|---|---|
| CN | 111653201 A | 9/2020 |
| KR | 10-0724569 B1 | 6/2007 |
| KR | 10-2020-0102580 A | 9/2020 |
| KR | 1020200135637 A | 12/2020 |
| KR | 1020200145954 A | 12/2020 |

* cited by examiner

DISPLAY APPARATUS AND METHOD OF MANUFACTURING THE SAME

CROSS-REFERENCE TO RELATED APPLICATION

This application claims priority under 35 U.S.C. § 119 to Korean Patent Application No. 10-2021-0000985, filed on Jan. 5, 2021, in the Korean Intellectual Property Office; the Korean Patent Application is incorporated by reference.

BACKGROUND

1. Field

The technical field relates to a display apparatus and a method of manufacturing the display apparatus.

2. Description of the Related Art

A display apparatus may display images according to input signals. The images may be displayed in a display area of the display apparatus. In addition to the display of images, various additional functions (such as a sensing function) may be provided within the display area.

SUMMARY

Embodiments may be related to a display apparatus that includes a display area for displaying images according to input signals. Embodiments may be related to a method of manufacturing the display apparatus.

According to one or more embodiments, a display apparatus includes a substrate in which a first transmission area is defined, a plurality of display elements arranged on the substrate and spaced from each other with the first transmission area therebetween, and an insulating layer arranged between the substrate and the plurality of display elements and including a first opening corresponding to the first transmission area, wherein an edge of the first opening includes a plurality of first convex portions.

Each of the plurality of first convex portions may be convex in a direction spaced from a center of the first opening, and the edge of the first opening may further include a first concave portion between adjacent first convex portions from among the plurality of first convex portions.

The edge of the first opening may further include a first edge portion and a second edge portion spaced from each other in a first direction with a center of the first opening therebetween, and a third edge portion and a fourth edge portion spaced from each other in a second direction with the center of the first opening therebetween.

The edge of the first opening may further include a fifth edge portion having a first end connected to the first edge portion and a second end connected to the third edge portion and opposite to the first end, and a sixth edge portion having a first end connected to the first edge portion and a second end connected to the fourth edge portion and opposite to the first end.

The display apparatus may further include a conductive layer arranged between the substrate and the insulating layer and including a second opening corresponding to the first opening.

An edge of the second opening may include a plurality of second convex portions.

The conductive layer may include a lower conductive layer and an upper conductive layer on the lower conductive layer.

A first thickness of the lower conductive layer may be less than a second thickness of the upper conductive layer.

The upper conductive layer may include an undercut structure.

The display apparatus may further include a plurality of transistors arranged on the conductive layer and electrically connected to the plurality of display elements, respectively, wherein the conductive layer and the plurality of transistors may at least partially overlap each other.

A plurality of transmission areas including the first transmission area may be defined on the substrate, the insulating layer may include a plurality of openings including the first opening and respectively corresponding to the plurality of transmission areas, and the plurality of openings may be arranged in a row direction and a column direction.

According to one or more embodiments, a method of manufacturing a display apparatus may include the following steps: preparing a substrate in which a transmission area is defined, forming a conductive material layer on the substrate, forming, on the conductive material layer, an insulating layer including a first opening corresponding to the transmission area, sequentially forming an organic material layer, an electrode layer, and a capping layer on the conductive material layer and the insulating layer, and removing a portion of the organic material layer, a portion of the electrode layer, and a portion of the capping layer, the portions corresponding to the first opening, by irradiating a laser beam onto at least a portion of the conductive material layer, wherein an edge of the first opening includes a plurality of first convex portions.

The forming of the conductive material layer on the substrate may include sequentially forming a first conductive material layer and a second conductive material layer on the substrate.

The method may further include forming an upper conductive layer including a second opening corresponding to the first opening, by removing at least a portion of the second conductive material layer.

The method may further include forming a pixel electrode material layer on the insulating layer, and forming a pixel electrode by removing at least a portion of the pixel electrode material layer, wherein the forming of the pixel electrode and the forming of the upper conductive layer may be simultaneously performed.

The forming of the pixel electrode and the forming of the upper conductive layer may be performed via wet etching.

An edge of the second opening may include a plurality of second convex portions.

The method may further include forming a lower conductive layer including a third opening corresponding to the second opening, by removing at least a portion of the first conductive material layer.

The removing of the portion of the organic material layer, the portion of the electrode layer, and the portion of the capping layer and the forming of the lower conductive layer may be simultaneously performed.

The irradiating of the laser beam onto the at least the portion of the conductive material layer may include irradiating the laser beam onto a lower surface of the substrate, the lower surface corresponding to the transmission area and opposite to an upper surface of the substrate.

An embodiment may be related to a display apparatus. The display apparatus may include a substrate, display elements overlapping the substrate and spaced from each other, and an insulating layer arranged between the substrate and the display elements. The insulating layer may include a first protrusion and a first opening. The first opening may be positioned between the display elements in a plan view of the display apparatus. An edge of the first opening may include first-set convex portions. The first protrusion may be positioned between two of the first-set convex portions and may protrude toward an inner part (and/or center) of the first opening.

Each of the first-set convex portions may be convex toward an outer perimeter of the insulating layer. The edge of the first opening may further include a first concave portion positioned between the two of the first-set convex portions and corresponding to the first protrusion.

The edge of the first opening may further include the following structures: a first edge portion and a second edge portion spaced from each other in a first direction with a center of the first opening being positioned between the first edge portion and the second edge portion; and a third edge portion and a fourth edge portion spaced from each other in a second direction (different from the first direction) with the center of the first opening being positioned between the third edge portion and the fourth edge portion. Each of the first to fourth edge portions may include the first-set convex portions.

The edge of the first opening may further include the following structures: a fifth edge portion having two ends respectively directly connected to the first edge portion and the third edge portion; and a sixth edge portion having two ends respectively directly connected to the first edge portion and the fourth edge portion. Each of the fifth and sixth edge portions may include the first-set convex portions.

The display apparatus may further include a conductive layer arranged between the substrate and the insulating layer. The conductive layer may include a second opening corresponding to the first opening.

An edge of the second opening may include second-set convex portions. The conductive layer may include a second protrusion. The second protrusion may be positioned between two of the second-set convex portions and may protrude toward an inner part (and/or center) of the second opening.

The conductive layer may include a first conductive layer and a second conductive layer overlapping the first conductive layer. The first conductive layer may be positioned between the substrate and the second conductive layer.

The first conductive layer may be thinner than the second conductive layer in a direction perpendicular to the substrate.

The second conductive layer may include an undercut structure.

The display apparatus may further include transistors that at least partially overlap the conductive layer and are electrically connected to the display elements, respectively.

The insulating layer may include openings. The openings may include the first opening and may be arranged in a row direction and a column direction.

An embodiment may be related to a method of manufacturing a display apparatus. The method may include the following steps: preparing a substrate; forming a conductive material layer on the substrate; forming an insulating layer on the conductive material layer, wherein the insulating layer may include a first opening and a first protrusion; sequentially forming an organic material layer, an electrode layer, and a capping layer on the conductive material layer and the insulating layer; and removing a portion of the organic material layer, a portion of the electrode layer, and a portion of the capping layer from the first opening by irradiating a laser beam onto at least a portion of the conductive material layer. An edge of the first opening may include first-set convex portions. The first protrusion may be positioned between two of the first-set convex portions and may protrude toward an inner part (and/or center) of the first opening.

The forming of the conductive material layer on the substrate may include sequentially forming a first conductive material layer and a second conductive material layer on the substrate.

The method may further include, by partially removing the second conductive material layer, forming an upper conductive layer that includes a second opening corresponding to the first opening.

The method may further include the following steps: forming a pixel electrode material layer on the insulating layer; and forming a pixel electrode by partially removing the pixel electrode material layer. The forming of the pixel electrode and the forming of the upper conductive layer may be simultaneously performed.

The forming of the pixel electrode and the forming of the upper conductive layer may be performed via wet etching.

An edge of the second opening may include second-set convex portions. The upper conductive layer may further include a second protrusion. The second protrusion may be positioned between two of the second-set convex portions and may protrude toward an inner part of the second opening.

The method may further include, by partially removing the first conductive material layer, forming a lower conductive layer that includes a third opening corresponding to the second opening.

The removing of the portion of the organic material layer, the portion of the electrode layer, and the portion of the capping layer and the forming of the lower conductive layer may be simultaneously performed.

The irradiating of the laser beam onto the at least the portion of the conductive material layer may include irradiating the laser beam onto a portion of a lower surface of the substrate that corresponds to the first opening. An upper surface of the substrate may be positioned between the lower surface of the substrate and the insulating layer.

DETAILED DESCRIPTION

Figure 1:
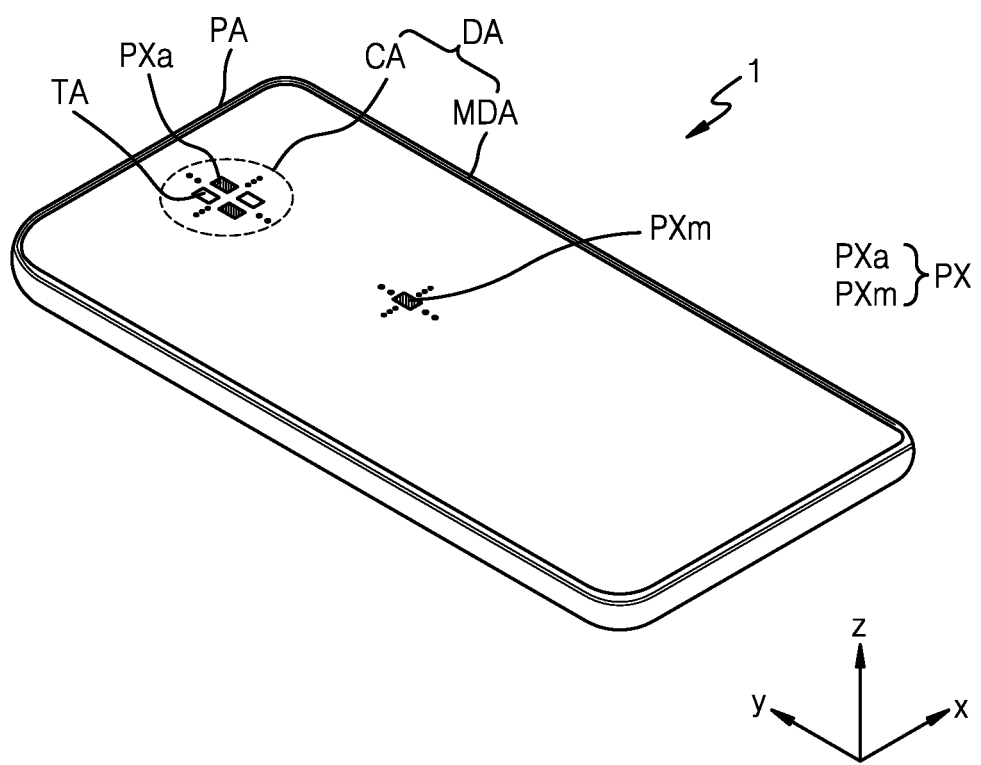
FIG. 1 is a schematic perspective view of a display apparatus according to an embodiment.

Example embodiments are described with reference to the accompanying drawings, wherein like reference numerals may refer to like elements.

Although the terms "first," "second," etc. may be used to describe various features, these features should not be limited by these terms. These components may be used to distinguish one feature from another. A first feature may be termed a second feature without departing from teachings of one or more embodiments. The description of a feature as a "first" feature may not require or imply the presence of a second feature or other features. The terms "first," "second," etc. may be used to differentiate different categories or sets of features. For conciseness, the terms "first," "second," etc. may represent "first-category (or first-set)," "second-category (or second-set)," etc., respectively.

The singular expressions "a," "an," and "the" may cover the plural forms as well, unless the context clearly indicates otherwise.

The terms "comprise/include" and/or "comprising/including" may specify the presence of stated features or components, but may not preclude the presence or addition of one or more other features or components.

When a first element is referred to as being "on" a second element, the first element can be directly or indirectly on the second element. One or more intervening elements may be present between the first element and the second element.

Dimensions in the drawings may be exaggerated for convenience of explanation.

When a certain embodiment may be implemented differently, a specific process order may be performed differently from the described order. For example, two consecutively described processes may be performed substantially at the same time or performed in an order opposite to the described order.

Each of the expressions "A and/or B" and the expression "at least one of A and B" may indicate "A," "B," or "A and B."

The term "connect" may mean "directly connect," "indirectly connect," "electrically connect," and/or "electrically connect through no intervening transistor." The term "conductive" may mean "electrically conductive." The term "insulate" may mean "electrically insulate" or "electrically isolate." The term "contact" may mean "directly contact" or "indirectly contact." The term "edge" may mean "perimeter." The term "planar shape" may mean "shape in a plan view." The term "adjacent" may mean "immediately adjacent" or "immediately neighboring." The term "when" may mean "if." A listing of elements/materials may mean at least one of the listed elements/materials.

The x-axis, the y-axis, and the z-axis may or may not be perpendicular to one another.

FIG. 1 is a schematic perspective view of a display apparatus 1 according to an embodiment.

Referring to FIG. 1, the display apparatus 1 may include a display area DA and a peripheral area PA outside the display area DA. The display area DA may include a component area CA and a main display area MDA at least partially surrounding the component area CA. The component area CA and the main display area MDA may separately or collectively display an image. The peripheral area PA may include a non-display area including no dynamic display elements. The display area DA may be entirely/substantially surrounded by the peripheral area PA.

FIG. 1 illustrates one component area CA in the main display area MDA. The display apparatus 1 may include two or more component areas CA, which may have identical or different shapes and/or sizes. In a plan view of the display apparatus 1, the component area CA may have one or more of various shapes, including a circular shape, an oval shape, a quadrangular shape, a star shape, a diamond shape, etc. The position(s) of the component area(s) CA may be configured according to embodiments.

The display apparatus 1 may provide an image by using a plurality of pixels PX arranged in the display area DA. The display apparatus 1 may provide an image using a plurality of main pixels PXm arranged in the main area MDA and a plurality of auxiliary pixels PXa arranged in the component area CA. Each of the main pixels PXm and each of the auxiliary pixels PXa may include a display element, such as an organic light-emitting diode OLED. Each pixel PX may emit, for example, red, green, blue, or white light through the organic light-emitting diode OLED. Each pixel PX (i.e., PXm or PXa) may be a sub-pixel, such as one of a red sub-pixel, a green sub-pixel, and a blue sub-pixel.

Figure 2:
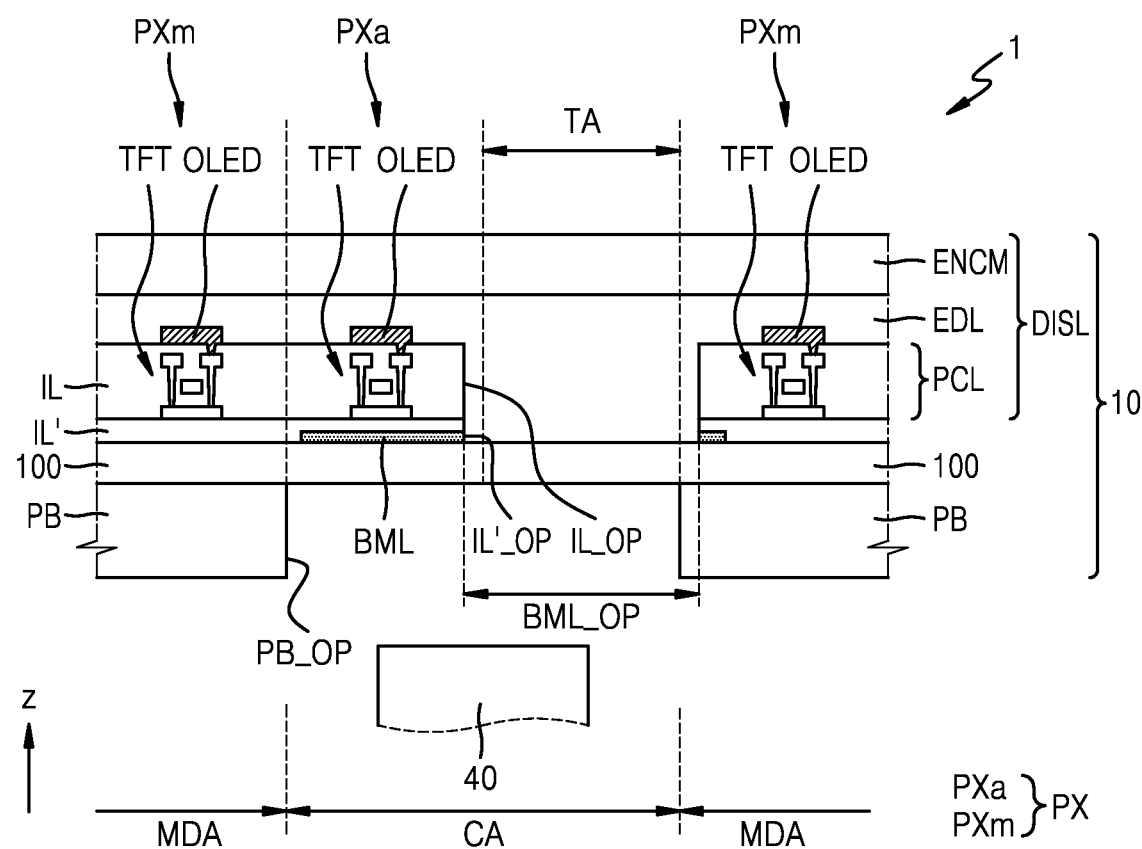
FIG. 2 is a schematic cross-sectional view of a display apparatus according to an embodiment.

Referring to FIG. 2, a component 40 (e.g., an electronic element) may be arranged below a display panel and may correspond to the component area CA. The component 40 may be/include a camera using infrared rays or visible rays. The component 40 may be/include at least one of a solar battery, a flash device, an illuminance sensor, a proximity sensor, an iris sensor, etc. The component 40 may transmit and/or receive sound. The component area CA may include a transmission area TA for transmitting light and/or sound output from the component 40 or toward the component 40. The light transmittance of the component area CA and/or the transmission area TA may be about 10% or greater, about 40% or greater, about 25% or greater, about 50% or greater, about 85% or greater, or about 90% or greater.

The auxiliary pixels PXa may be arranged in the component area CA. The auxiliary pixels PXa may emit light to provide a certain image. The image displayed in the component area CA may be an auxiliary image, which may have a lower resolution than an image displayed in the main area MDA. No pixels may be arranged in the transmission area TA. Therefore, the density of auxiliary pixels PXa in the component area CA may be less than the density of main pixels PXm in the main area MDA.

FIG. 2 is a schematic cross-sectional view of the display apparatus 1 according to an embodiment.

Referring to FIG. 2, the display apparatus 1 may include a display panel 10 and the component 40 overlapping the display panel 10. A cover window (not shown) protecting the display panel 10 may be arranged above the display panel 10.

The display panel 10 may include the component area CA, which overlaps the component 40, and may include the main display area MDA, in which a main image is displayed. The display panel 10 may include a substrate 100, a conductive layer BML on the substrate 100, a display layer DISL on the conductive layer BML, and a protection member PB below the substrate 100. The display panel 10 and/or the substrate 100 may be understood may include a component area CA and a main display area MDA that respectively correspond to the component area CA and the main display area MDA of the display apparatus 1.

The display layer DISL may include a circuit layer PCL including a transistor TFT, may include a display element layer EDL including an organic light-emitting diode OLED (which is a display element), and may include an encapsulation member ENCM, such as an encapsulation substrate. Insulating layers IL and IL' may be arranged in the display layer DISL between the substrate 100 and the display layer DISL.

The substrate 100 may include an insulating material, such as glass, quartz, and/or polymer resins. The substrate 100 may include a rigid substrate or a flexible substrate, which may be bent, folded, or rolled.

The display panel 10 may provide an image using a plurality of pixels PX, including main pixels PXm and auxiliary pixels PXa. The main pixels PXm may be arranged in the main display area MDA. Auxiliary pixels PXa may be arranged in the component area CA. Each main pixel PXm and each auxiliary pixel PXa may include a transistor TFT and an organic light-emitting diode OLED electrically connected to the transistor TFT. An area of the component area CA that accommodates the auxiliary pixels PXa may be referred to as an auxiliary display area.

The component area CA may include the transmission area TA in which no display element is arranged. The transmission area TA may transmit light and/or sound toward the component 40 and/or output from the component 40. Multiple auxiliary display areas and multiple transmission areas TA may be alternately arranged in the component area CA.

The conductive layer BML may be arranged between the substrate 100 and the display layer DISL, for example, between the substrate 100 and the transistor TFT or between the substrate 100 and insulating layers IL and IL'. The conductive layer BML may have at least one opening BML_OP through which light or sound may pass. The opening BML_OP of the conductive layer BML may be located in the transmission area TA and may format least partially expose the component 40. A metal material portion (or a metal portion) of the conductive layer BML may prevent diffraction of light potentially caused by a small gap between the transistors TFT arranged in the component area CA or by a small gap between lines connected to the transistors TFT.

Although not illustrated in FIG. 2, the conductive layer BML may be electrically connected to the transistor TFT. The conductive layer BML may be connected to a gate electrode, a source electrode, or a drain electrode of the transistor TFT. The conductive layer BML may have a voltage level that is the same as a voltage level of the gate electrode, the source electrode, or the drain electrode of the transistor TFT. When the conductive layer BML has a certain voltage level, the performance of the TFT may be maintained in a desirable state.

Each of the insulating layers IL and IL' (arranged in the display layer DISL between the substrate 100 and the display layer DISL) may have at least one opening IL_OP or IL'_OP. Light emitted from or progressing toward the component 40 may pass through the openings IL_OP and IL'_OP of the insulating layers IL and IL'. The openings IL_OP and IL'_OP of the insulating layers IL and IL' may be located in the transmission area TA and may at least partially expose the component 40.

A planar shape of the opening BML_OP of the conductive layer BML may substantially similar/identical to a planar shape of the openings IL_OP and IL'_OP of the insulating layers IL and IL'.

The display element layer EDL may be covered by the encapsulation member ENCM. The encapsulation member ENCM may include/be an encapsulation substrate and/or a thin-film encapsulation layer.

The encapsulation member ENCM may include an encapsulation substrate. The encapsulation substrate may face the substrate 100 with the display element layer EDL between the encapsulation substrate and the substrate 100. A gap may be between the encapsulation substrate and the display element layer EDL. The encapsulation substrate may include glass. A sealant including frit, etc. may be arranged between the substrate 100 and the encapsulation substrate, and the sealant may be arranged in the peripheral area PA described with reference to FIG. 1. The sealant arranged in the peripheral area PA may surround the display area DA and may prevent penetration of water.

The encapsulation member ENCM may include a thin-film encapsulation layer. The thin-film encapsulation layer may include at least one inorganic encapsulation layer and at least one organic encapsulation layer. The thin-film encapsulation layer may include a first inorganic encapsulation layer, a second inorganic encapsulation layer, and an organic encapsulation layer between the inorganic encapsulation layers.

The protection member PB may be coupled under the substrate 100 to support and protect the substrate 100. The protection member PB may include an opening PB_OP that corresponds to the component area CA. Because the protection member PB includes the opening PB_OP, the light transmittance of the component area CA may be satisfactory. The protection member PB may include polyethylene terephthalate (PET) or polyimide (PI).

An area of the component area CA may be greater than an area of the component 40. An area of the opening PB_OP provided in the protection member PB may be unequal to the area of the component area CA.

Multiple components 40 may be arranged in the component area CA. The components 40 may have different functions from one another. The components 40 may include at least two of a camera (an imaging device), a solar battery, a flash device, a proximity sensor, an illuminance sensor, and an iris sensor.

Figure 3:
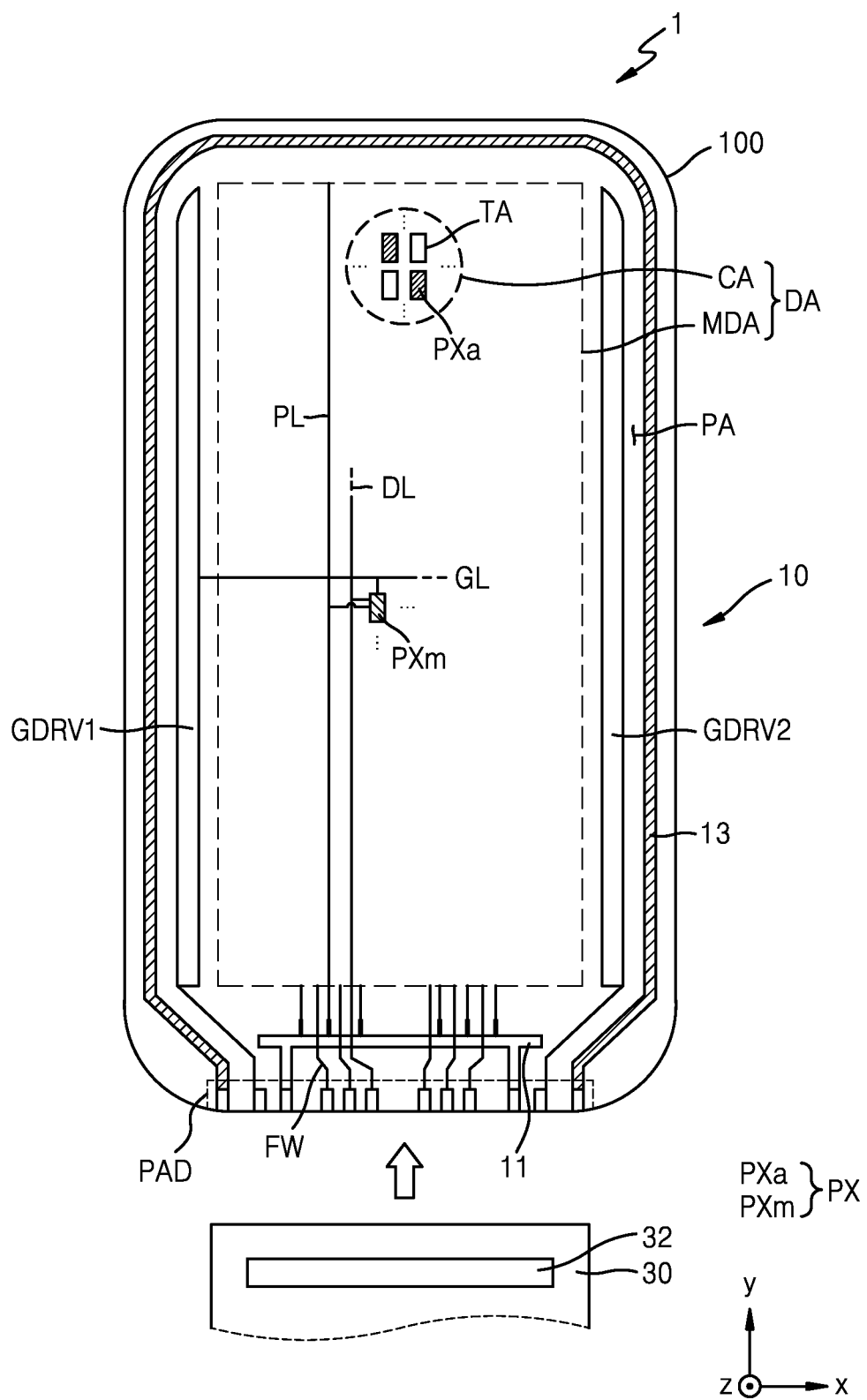
FIG. 3 is a schematic plan view of a display apparatus according to an embodiment.

FIG. 3 is a schematic plan view of the display apparatus 1 according to an embodiment.

Referring to FIG. 3, various components included in the display panel 10 may be arranged on the substrate 100. The substrate 100 may include the display area DA and the peripheral area PA surrounding the display area DA. The display area DA may include the main display area MDA for displaying a main image and may include the component area CA having the transmission area TA and configured for displaying an auxiliary image. The auxiliary image may form a combined image with the main image or may be an image not directly related to the main image.

The main pixels PXm may be arranged in the main display area MDA. Each of the main pixels PXm may be include a display element such as an organic light-emitting diode OLED. Each main pixel PXm may emit, for example, red, green, blue, or white light. The main display area MDA may be covered by an encapsulation member and may be protected from external air, moisture, etc.

The component area CA may be located at a side of the main display area MDA or may be surrounded by the main display area MDA. The auxiliary pixels PXa may be arranged in the component area CA. Each of the auxiliary pixels PXa may include a display element such as an organic light-emitting diode OLED. Each auxiliary pixel PXa may emit, for example, red, green, blue, or white light. The component area CA may be covered by an encapsulation member and may be protected from external air, moisture, etc.

The component area CA may have the transmission area TA. The transmission area TA may surround or may be surrounded by the auxiliary pixels PXa. The transmission area TA may form a grid or array with the auxiliary pixels PXa.

Because the component area CA has the transmission area TA, a resolution of the component area CA may be lower than a resolution of the main display area MDA. The resolution of the component area CA may be about ½, ⅜, ⅓, ¼, 2/9, ⅛, 1/9, 1/12.25, or 1/16 of the resolution of the main display area MDA. The resolution of the main display area MDA may be about 400 ppi or higher, and the resolution of the component area CA may be about 200 ppi or about 100 ppi.

There may be a plurality of component areas CA. The component areas CA may be spaced from each other. A first camera may correspond to one component area CA, and a second camera may correspond to another component area CA. A camera may correspond to one component area CA, and an infrared sensor may correspond to another component area CA. Shapes and/or sizes of the component areas CA may or may not be different.

The component area CA may have a circular shape, an oval shape, a polygonal shape, or an atypical shape. In some embodiments, the component area CA may have an octagonal shape. The component areas CA may have one or more of various polygonal shapes, such as a quadrangular shape, a hexagonal shape, etc.

Each pixel PX may be electrically connected to one or more of a first gate driving circuit GDRV1, a second gate driving circuit GDRV2, a pad portion PAD, a driving voltage supply line 11, and a common voltage supply line 13 arranged in the peripheral area PA.

The first gate driving circuit GDRV1 may be connected to a gate line GL extending in a ±x direction. The gate line GL may be connected to pixels PX located in the same row, and an electrical signal may be transmitted to the pixels PX located in the same row through the gate line GL.

FIG. 3 illustrates that the gate line GL includes one line. The gate line GL may include a plurality of lines. The gate line GL may include a scan line, an emission control line, etc.

The first gate driving circuit GDRV1 may include a scan driving circuit and an emission control driving circuit. The scan driving circuit may provide a scan signal to the pixels PX located in the same row through the scan line. The emission control driving circuit may provide an emission control signal to the pixels PX located in the same row through the emission control line. Features of the first gate driving circuit GDRV1 may be applicable to the second gate driving circuit GDRV2.

The second gate driving circuit GDRV2 may be arranged parallel to the first gate driving circuit GDRV1. The display area DA may be between the driving circuits GDRV1 and GDRV2. The pixels PX arranged in the display area DA may be electrically connected to both the first gate driving circuit GDRV1 and the second gate driving circuit GDRV2. Some of the pixels PX arranged in the display area DA may be electrically connected to the first gate driving circuit GDRV1, and the others may be connected to the second gate driving circuit GDRV2. One of the first gate driving circuit GDRV1 and the second gate driving circuit GDRV2 may be optional.

The pad portion PAD may be arranged at a side of the substrate 100. The pad portion PAD may be exposed and may be connected to a display circuit board 30. A display driver 32 may be arranged in the display circuit board 30.

The display driver 32 may generate a control signal to be transmitted to the first gate driving circuit GDRV1 and the second gate driving circuit GDRV2. The display driver 32 may generate a data signal, and the generated data signal may be transmitted to pixels PX located in the same column through a fan-out wire FW and a data line DL connected to the fan-out wire FW.

The display driver 32 may supply a driving voltage ELVDD (illustrated in FIG. 4) to the driving voltage supply line 11 and may supply a common voltage ELVSS (illustrated in FIG. 4) to the common voltage supply line 13. The driving voltage ELVDD may be applied to the pixels PX through a driving voltage line PL connected to the driving voltage supply line 11, and the common voltage ELVSS may be applied to an opposite electrode 223 (illustrated in FIG. 8) through the common voltage supply line 13.

The driving voltage supply line 11 may extend in a ±x direction outside the main display area MDA. The common voltage supply line 13 may have a loop shape having an open side and may partially surround the main display area MDA.

Figure 4:
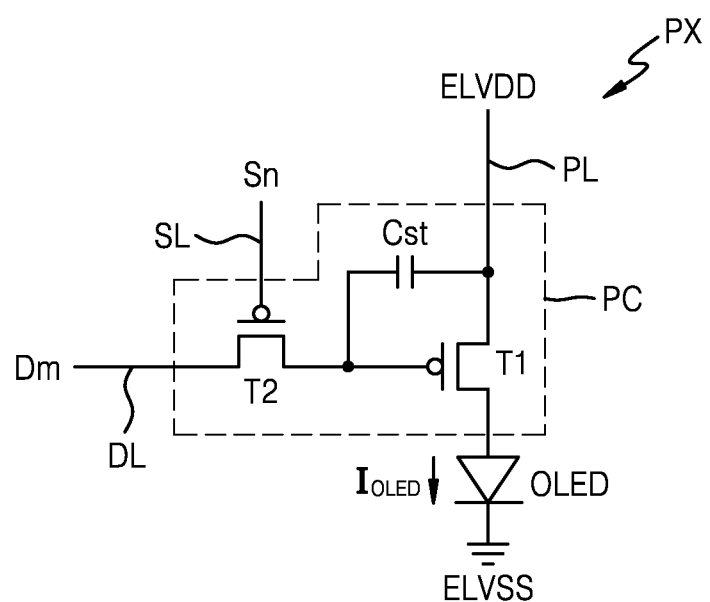
FIG. 4 is an equivalent circuit diagram of a pixel of a display apparatus according to an embodiment.

FIG. 4 is an equivalent circuit diagram of a pixel PX according to an embodiment.

Referring to FIG. 4, the pixel PX may include a pixel circuit PC connected to a scan line SL and a data line DL; the pixel PX may include an organic light-emitting diode OLED connected to the pixel circuit PC.

The pixel circuit PC may include a driving transistor T1, a scan transistor T2, and a storage capacitor Cst. The driving transistor T1 and the scan transistor T2 may include/be thin-film transistors.

The scan transistor T2 may be connected to the scan line SL and the data line DL and may transmit a data voltage Dm input through the data line DL to the driving transistor T1 in synchronization with a scan signal Sn input through the scan line SL.

The storage capacitor Cst may be connected to the scan transistor T2 and the driving voltage line PL and may store a voltage corresponding to a difference between the data voltage Dm received from the scan transistor T2 and the driving voltage ELVDD supplied to the driving voltage line PL.

The driving transistor T1 may be connected to the driving voltage line PL and the storage capacitor Cst and may control a magnitude of a driving current flowing from the driving voltage line PL through the organic light-emitting diode OLED in correspondence with a voltage value stored in the storage capacitor Cst. The organic light-emitting diode OLED may emit light having brightness corresponding to the magnitude of the driving current via the driving current.

FIG. 4 illustrates that the pixel circuit PC includes two transistors and one storage capacitor. The pixel circuit PC may include three or more transistors and/or two or more storage capacitors.

Figure 5:
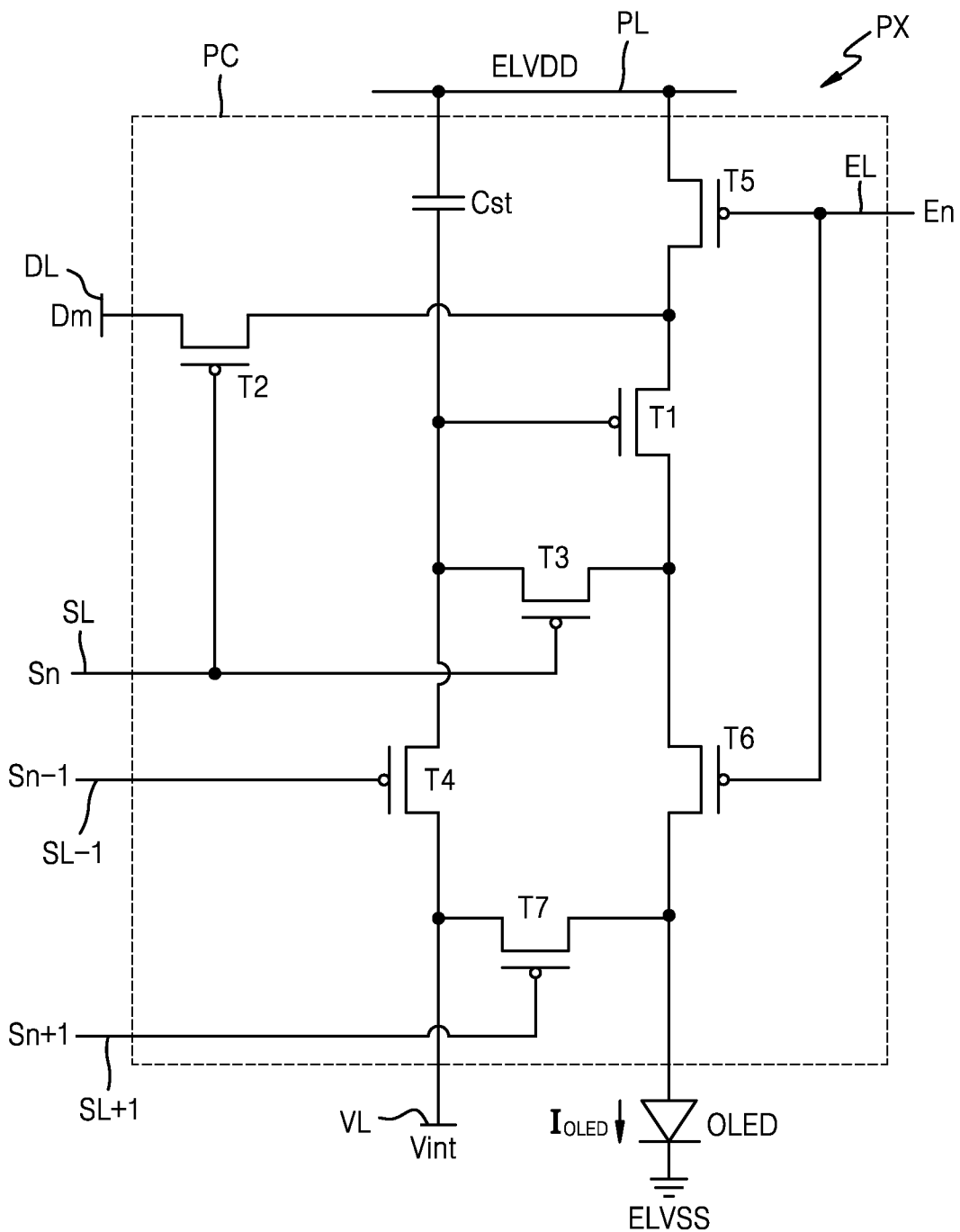
FIG. 5 is an equivalent circuit diagram of a pixel of a display apparatus according to an embodiment.

FIG. 5 is an equivalent circuit diagram of a pixel PX according to an embodiment.

Referring to FIG. 5, one pixel PX may include a pixel circuit PC and an organic light-emitting diode OLED electrically connected to the pixel circuit PC.

The pixel circuit PC may include first through seventh transistors T1 through T7 and a storage capacitor Cst, as illustrated in FIG. 5. The first through seventh transistors T1 through T7 and the storage capacitor Cst may be connected to first through third scan lines SL, SL−1, and SL+1 respectively transmitting first through third scan signals Sn, Sn−1, and Sn+1, a data line DL transmitting a data voltage Dm, an emission control line EL transmitting an emission control signal En, a driving voltage line PL transmitting a driving voltage ELVDD, an initialization voltage line VL transmitting an initialization voltage Vint, and a common electrode to which a common voltage ELVSS is applied.

The first transistor T1 may be a driving transistor, a magnitude of a drain current of which is determined according to a gate-source voltage, and the second through seventh transistors T2 through T7 may be switching transistors that are turned on/off according to a gate-source voltage, in reality, a gate voltage. The first through seventh transistors T1 through T7 may include/be thin-film transistors.

The first thin-film transistor T1 may be a driving transistor, the second thin-film transistor T2 may be a scan transistor, the third thin-film transistor T3 may be a compensation transistor, the fourth thin-film transistor T4 may be a gate initialization transistor, the fifth thin-film transistor T5 may be a first emission control transistor, the sixth thin-film transistor T6 may be a second emission control transistor, and the seventh thin-film transistor T7 may be an anode initialization transistor.

The storage capacitor Cst may be connected between the driving voltage line PL and a gate of the driving transistor T1. The storage capacitor Cst may have an upper electrode CE2 connected to the driving voltage line PL and a lower electrode CE1 connected to the gate of the driving transistor T1.

The driving transistor T1 may control a magnitude of a driving current $I_{OLED}$ flowing from the driving voltage line PL to the organic light-emitting diode OLED according to the gate-source voltage. The driving transistor T1 may have the gate connected to the lower electrode CE1 of the storage capacitor Cst, a source connected to the driving voltage line PL through the first emission control transistor T5, and a drain connected to the organic light-emitting diode OLED through the second emission control transistor T6.

The driving transistor T1 may output the driving current $I_{OLED}$ to the organic light-emitting diode OLED according to the gate-source voltage. The magnitude of the driving current $I_{OLED}$ may be determined based on a difference between the gate-source voltage of the driving transistor T1 and a threshold voltage. The organic light-emitting diode OLED may receive the driving current $I_{OLED}$ from the driving transistor T1 and emit light by a brightness according to the magnitude of the driving current $I_{OLED}$.

The scan transistor T2 may transmit the data voltage Dm to the source of the driving transistor T1 in response to the first scan signal Sn. The scan transistor T2 may have a gate connected to the first scan line SL, a source connected to the data line DL, and a drain connected to the source of the driving transistor T1.

The compensation transistor T3 may be connected in series between the drain and the gate of the driving transistor T1 and may connect the drain with the gate of the driving transistor T1 in response to the first scan signal Sn. The compensation transistor T3 may have a gate connected to the first scan line SL, a source connected to the drain of the driving transistor T1, and a drain connected to the gate of the driving transistor T1. FIG. 5 illustrates that the compensation transistor T3 includes one transistor. However, the compensation transistor T3 may include two transistors connected in series with each other.

The gate initialization transistor T4 may apply an initialization voltage Vint to the gate of the driving transistor T1 in response to the second scan signal Sn−1. The gate initialization transistor T4 may have a gate connected to the second scan line SL−1, a source connected to the gate of the driving transistor T1, and a drain connected to the initialization voltage line VL. FIG. 5 illustrates that the gate initialization transistor T4 includes one transistor. However, the gate initialization transistor T4 may include two transistors connected in series with each other.

The anode initialization transistor T7 may apply the initialization voltage Vint to an anode of the organic light-emitting diode OLED in response to the third scan signal Sn+1. The anode initialization transistor T7 may have a gate connected to the third scan line SL+1, a source connected to the anode of the organic light-emitting diode OLED, and a drain connected to the initialization voltage line VL.

The first emission control transistor T5 may connect the driving voltage line PL with the source of the driving transistor T1 in response to the emission control signal En. The first emission control transistor T5 may have a gate connected to the emission control line EL, a source connected to the driving voltage line PL, and a drain connected to the source of the driving transistor T1.

The second emission control transistor T6 may connect the drain of the driving transistor with the anode of the organic light-emitting diode OLED in response to the emission control signal En. The second emission control transistor T6 may have a gate connected to the emission control line EL, a source connected to the drain of the driving transistor T1, and a drain connected to the anode of the organic light-emitting diode OLED.

The second scan signal Sn−1 may be substantially synchronized with the first scan signal Sn of a previous row. The third scan signal Sn+1 may be substantially synchronized with the first scan signal Sn. The third scan signal Sn+1 may be substantially synchronized with the first scan signal Sn of a next row.

The first through seventh transistors T1 through T7 may include a semiconductor layer including silicon. The first through seventh transistors T1 through T7 may include semiconductor layers including low temperature polysilicon (LTPS). A polysilicon material may have a high electron mobility (100 cm$^2$/Vs or higher), and thus, may have low power consumption and high reliability. The semiconductor layers of the first through seventh transistors T1 through T7 may include an oxide of at least one of In, Ga, Sn, Zr, V, Hf, Cd, Ge, Cr, Ti, Al, Cs, Ce, and Zn. For example, a semiconductor layer A may include an InSnZnO (ITZO) semiconductor layer, an InGaZnO (IGZO) semiconductor layer, etc. Some semiconductor layers of the first through seventh transistors T1 through T7 may include LTPS, and the others may include oxide semiconductors (IGZO, etc.).

The first through seventh transistors T1 through T7 may be p-type metal oxide semiconductor field-effect transistors (MOSFETs).

When an emission control signal En of a high level is received, the first emission control transistor T5 and the second emission control transistor T6 may be turned off, and the driving transistor T1 may stop outputting a driving current $I_{OLED}$ and the organic light-emitting diode OLED may stop emitting light.

Thereafter, during a gate initialization period during which a second scan signal Sn−1 of a low level is received, the gate initialization transistor T4 may be turned on, and an initialization voltage Vint may be applied to the gate of the driving transistor T1, that is, the lower electrode CE1 of the storage capacitor Cst. A difference ELVDD−Vint between the driving voltage ELVDD and the initialization voltage Vint may be stored in the storage capacitor Cst.

Thereafter, during a data write period during which a first scan signal Sn of a low level is received, the scan transistor T2 and the compensation transistor T3 may be turned on, and a data voltage Dm may be received by the source of the driving transistor T1. The driving transistor T1 may be diode-connected by the compensation transistor T3 and may be biased in a forward direction. A gate voltage of the driving transistor T1 may rise at the initialization voltage Vint. When the gate voltage of the driving transistor T1 becomes equal to a data compensation voltage Dm−|Vth| obtained by subtracting a threshold voltage Vth of the driving transistor T1 from the data voltage Dm, the driving transistor T1 may be turned off, and the gate voltage of the driving transistor T1 may stop rising. Thus, a difference ELVDD−Dm+|Vth| between the driving voltage ELVDD and the data compensation voltage Dm−|Vth| may be stored in the storage capacitor Cst.

During an anode initialization period during which a third scan signal Sn+1 of a low level is received, the anode initialization transistor T7 may be turned on, and the initialization voltage Vint may be applied to the anode of the organic light-emitting diode OLED. By completely stopping emission of the organic light-emitting diode OLED by applying the initialization voltage Vint to the anode of the organic light-emitting diode OLED, when a pixel PX in a next frame receives the data voltage Dm corresponding to a black gradation, minute emission of the organic light-emitting diode OLED may be eliminated.

The first scan signal Sn and the third scan signal Sn+1 may be substantially synchronized with each other, and in this case, the data write period and the anode initialization period may be the same period.

Thereafter, when an emission control signal En of a low level is received, the first emission control transistor T5 and the second emission control transistor T6 may be turned on, the driving transistor T1 may output a driving current $I_{OLED}$ corresponding to a voltage stored in the storage capacitor Cst, that is, the voltage ELVDD−Dm obtained by subtracting the threshold voltage Vth of the driving transistor T1 from the source-gate voltage ELVDD−Dm+|Vth| of the driving transistor T1, and the organic light-emitting diode OLED may emit light by a brightness corresponding to a magnitude of the driving current $I_{OLED}$.

Figure 6:
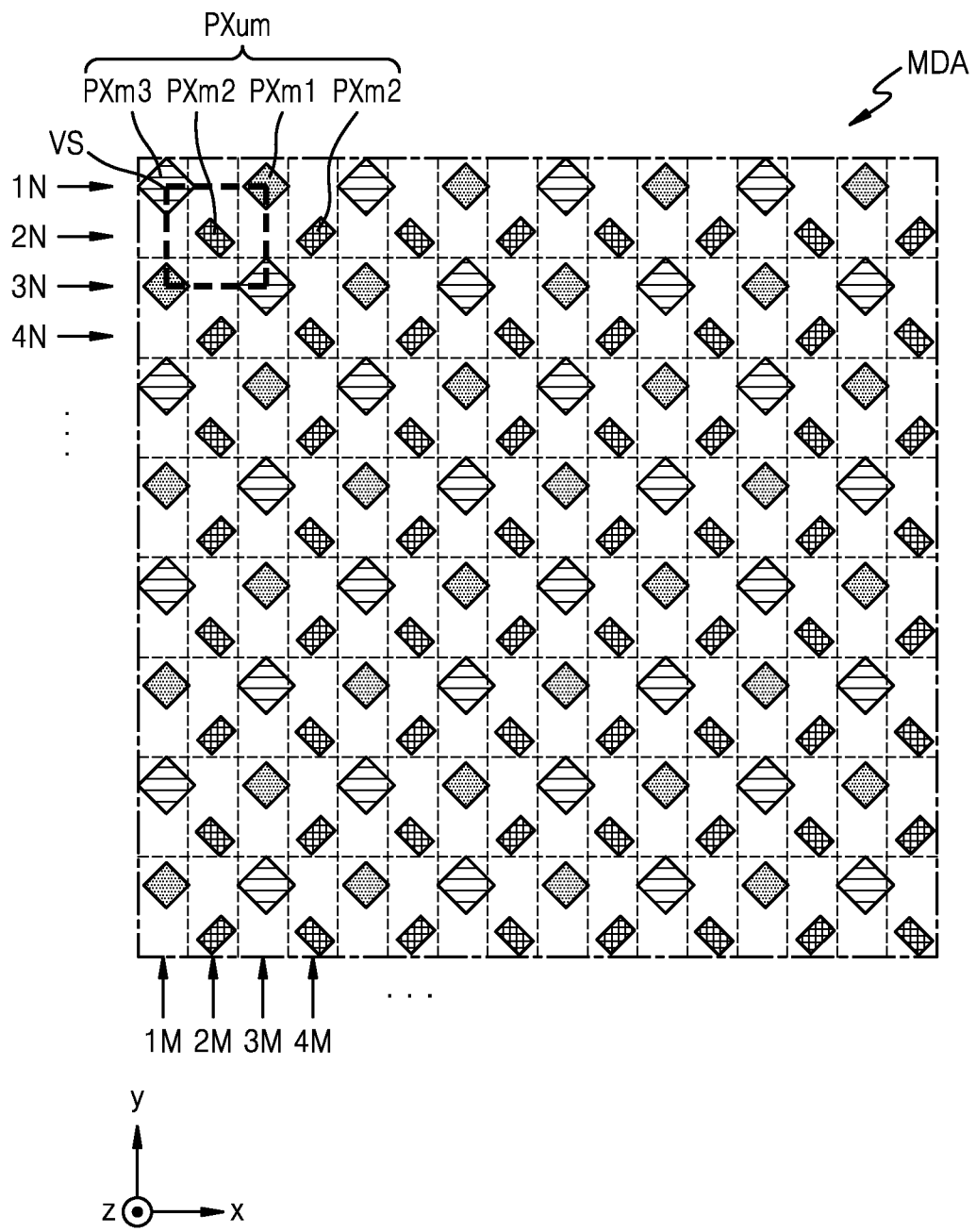
FIG. 6 is a plan view schematically illustrating a portion of a display apparatus according to an embodiment.

FIG. 6 is a plan view schematically illustrating a portion of a display apparatus according to an embodiment.

Referring to FIG. 6, main pixel units PXum may be arranged in the main display area MDA. Each of the main pixel units PXum may include a first main pixel PXm1, a second main pixel PXm2, and a third main pixel PXm3. The first main pixel PXm1, the second main pixel PXm2, and the third main pixel PXm3 may emit light of different colors. For example, the first main pixel PXm1 may emit red light, the second main pixel PXm2 may emit green light, and the third main pixel PXm3 may emit blue light.

The first main pixels PXm1, the second main pixels PXm2, and the third main pixels PXm3 may be arranged in a PENTILE™ structure.

Third main pixels PXm3 and first main pixels PXm1 may be alternately arranged in a ±x direction in a first row 1N, and second main pixels PXm2 may be spaced from the first main pixels PXm1 and the third main pixels PXm3 by a predetermined distance and may be arranged in a second row 2N adjacent to the first row 1N. First main pixels PXm1 and third main pixels PXm3 may be alternately arranged in the ±x direction in a third row 3N, and second main pixels PXm2 may be spaced from the third main pixels PXm3 and the first main pixels PXm1 by a predetermined distance and may be arranged in a fourth row 4N adjacent to the third row 3N. This type of arrangement of the main pixels may be repeated until an $n^{th}$ row, wherein n is a natural number.

A size (or a width) of the third main pixel PXm3 and the first main pixel PXm1 may be greater than a size (or a width) of the second main pixel PXm2.

The first main pixels PXm1 and the third main pixels PXm3 arranged in the first row 1N and the second main pixels PXm2 arranged in the second row 2N may be offset from each other. First main pixels PXm1 and third main pixels PXm3 may be alternately arranged in a ±y direction in a first column 1M, and second main pixels PXm2 may be spaced from the first main pixels PXm1 and the third main pixels PXm3 by a predetermined distance and may be arranged in a second column 2M adjacent to the first column 1M. Third main pixels PXm3 and first main pixels PXm1 may be alternately arranged in the ±y direction in a third column 3M, and second main pixels PXm2 may be spaced from the third main pixels PXm3 and the first main pixels PXm1 by a predetermined distance and may be arranged in a fourth column 4M adjacent to the third column 3M. This type of arrangement of the main pixels may be repeated until an $m^{th}$ column, wherein m is a natural number.

First main pixels PXm1 may be arranged at a first vertex and a third vertex of a virtual square VS having a center point as a center point of the second main pixels PXm2, the first and third vertexes facing each other; third main pixels PXm3 may be arranged at a second vertex and a fourth vertex, which are the other vertexes of the virtual square VS. The virtual square VS may be include one of a rectangular shape, a diamond shape, a square shape, etc.

Via the above-described PENTILE™ structure, a color may be displayed through sharing of adjacent pixels, so that a high resolution may be achieved using a relatively low number of pixels.

FIG. 6 illustrates that the main pixel units PXum are arranged in a PENTILE™ structure. The main pixel units PXum, the first main pixels PXm1, the second main pixels PXm2, and/or the third main pixels PXm3 may be arranged in one or more of a stripe structure, a mosaic arrangement structure, a delta arrangement structure, etc.

Figure 7:
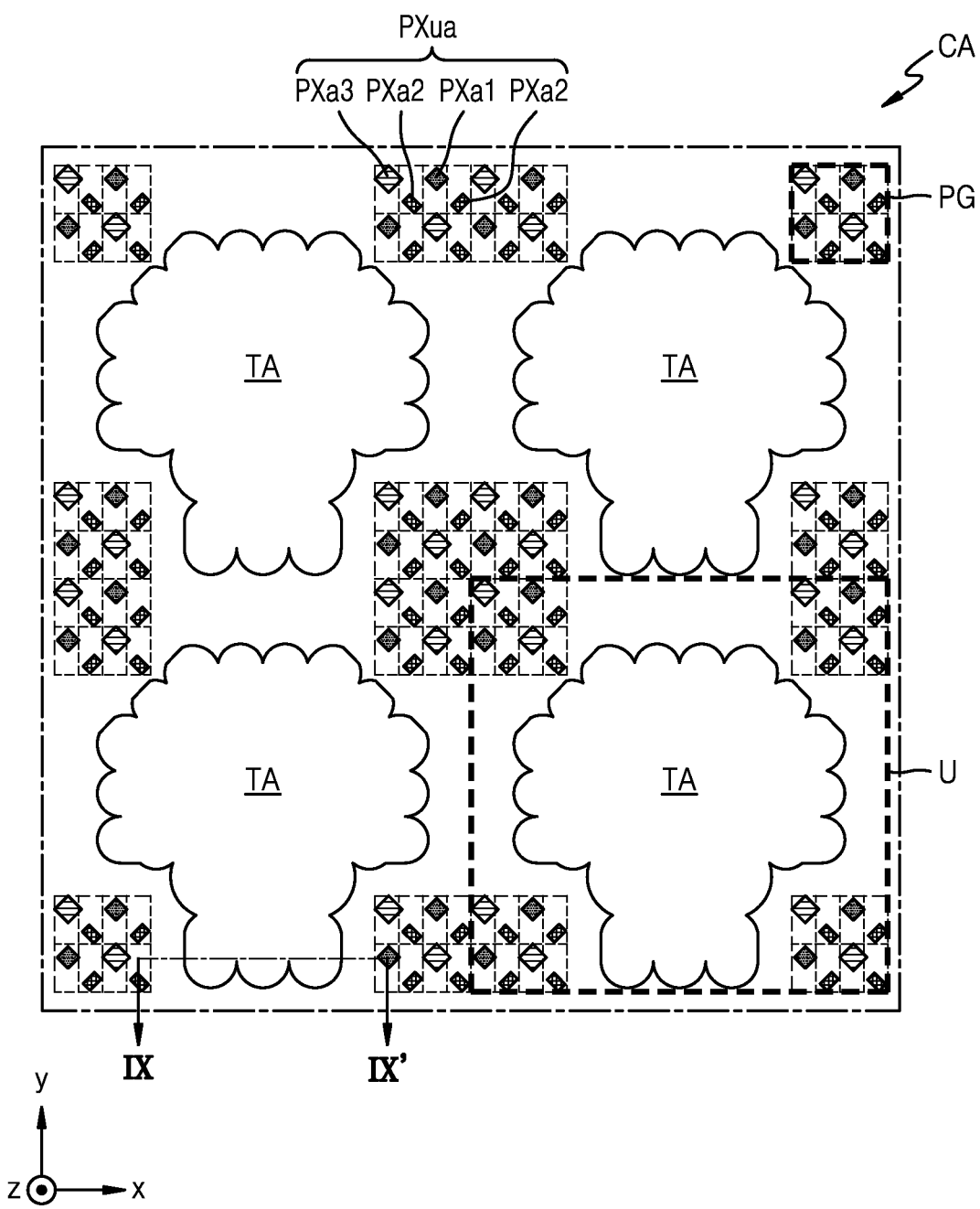
FIG. 7 is a plan view schematically illustrating another portion of a display apparatus according to an embodiment.

FIG. 7 is a plan view schematically illustrating another portion of a display apparatus according to an embodiment.

Referring to FIG. 7, auxiliary pixel units PXua may be arranged in the component area CA. Each of the auxiliary pixel units PXua may include a first auxiliary pixel PXa1, a second auxiliary pixel PXa2, and a third auxiliary pixel PXa3. The first auxiliary pixel PXa1, the second auxiliary pixel PXa2, and the third auxiliary pixel PXa3 may emit light of different colors. For example, the first auxiliary pixel PXa1 may emit red light, the second auxiliary pixel PXa2 may emit green light, and the third auxiliary pixel PXa3 may emit blue light.

The first auxiliary pixels PXa1, the second auxiliary pixels PXa2, and the third auxiliary pixels PXa3 may be arranged in a PENTILE™ structure analogous to the structure of the first main pixels PXm1, the second main pixels PXm2, and the third main pixels PXm3 described with reference to FIG. 6. The first auxiliary pixels PXa1, the second auxiliary pixels PXa2, and the third auxiliary pixels PXa3 may be arranged in a different structure. The first auxiliary pixels PXa1, the second auxiliary pixels PXa2, and the third auxiliary pixels PXa3 may be arranged in one or more of a stripe structure, a mosaic arrangement structure, a delta arrangement structure, etc.

The component area CA may include transmission areas TA. The transmission areas TA may be spaced from each other and may be two-dimensionally arranged in a ±x direction and a ±y direction. The auxiliary pixel units PXua may be arranged around the transmission area TA. Auxiliary pixels PXa may be grouped in a predetermined pixel group PG and may be arranged around the transmission area TA.

For example, one pixel group PG may include eight auxiliary pixels PXa arranged according to a PENTILE™ structure. FIG. 7 illustrates that one pixel group PG includes two first auxiliary pixels PXa1, four second auxiliary pixels PXa2, and two third auxiliary pixels PXa3.

The transmission areas TA may be arranged between the pixel groups PG. A transmission area TA may be arranged between two pixel groups PG adjacent to each other in a ±x direction, a ±y direction, or a direction different from the ±x direction and the ±y direction.

The transmission area TA may transmit light and/or sound and may include no auxiliary pixels PXa. Referring to one unit U illustrated in FIG. 7, one unit U may include one transmission area TA and four pixel groups PG around the transmission area TA. In one unit U, an area occupied by the transmission area TA and areas occupied by the pixel groups PG may have a trade-off relationship.

When a component requires a large amount of light, in one unit U, the area occupied by the transmission area TA may be relatively increased, and the areas occupied by the pixel groups PG may be relatively decreased. When a component requires a little amount of light, in one unit U, the area occupied by the transmission area TA may be relatively decreased, and the areas occupied by the pixel groups PG may be relatively increased. The areas occupied by the pixel groups PG may be about ¼ of the total area of one unit U. The areas occupied by the pixel groups PG in one unit U may be greater than or less than ¼ of the total area of the unit U.

The transmission area TA may have a substantially polygonal, oval, circular, or cross shape and may have concave and convex edge portions.

Figure 8:
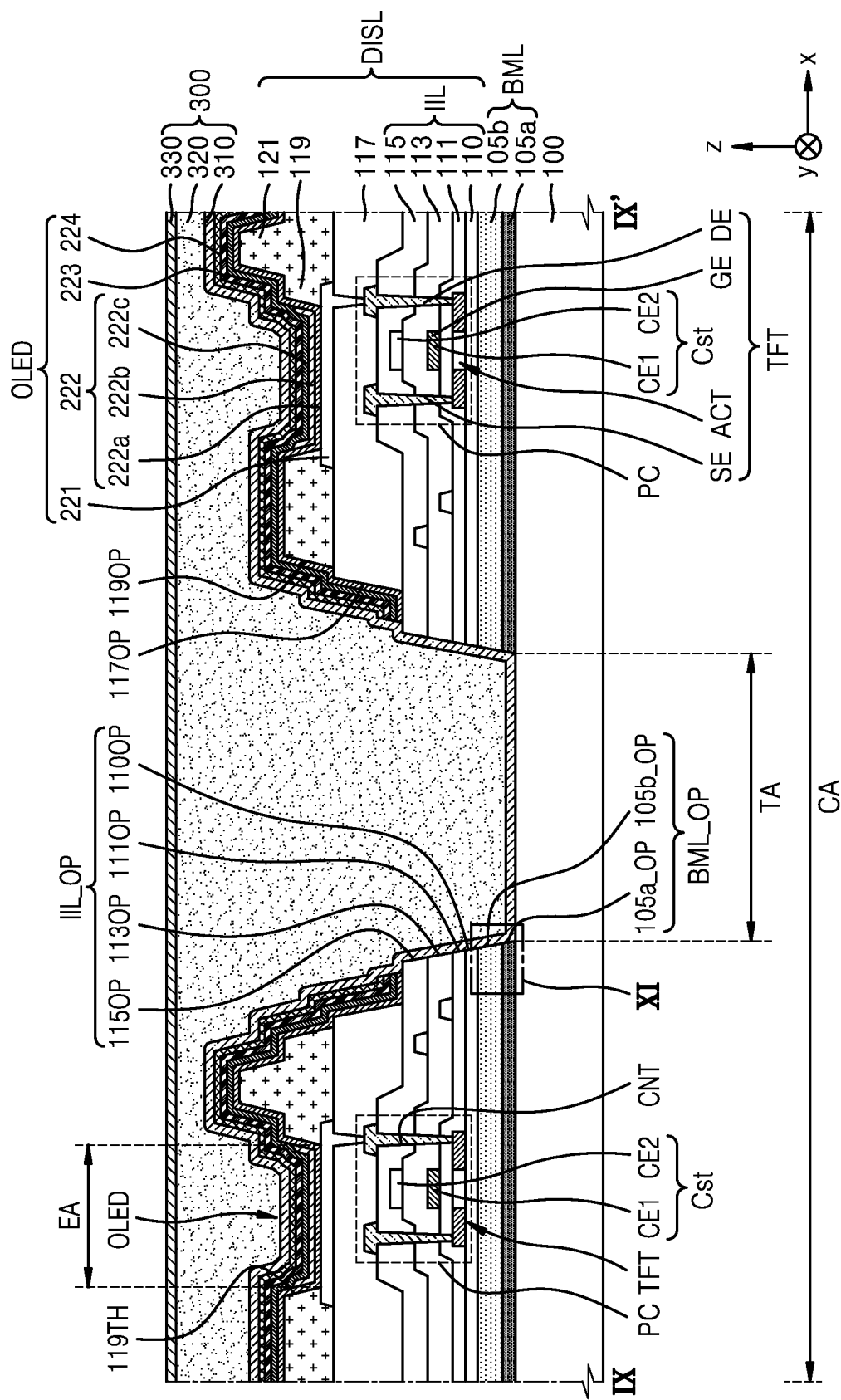
FIG. 8 is an example cross-sectional view taken along line IX-IX' of FIG. 7 according to an embodiment.

FIG. 8 is a cross-sectional view taken along line IX-IX' of FIG. 7 according to an embodiment.

Referring to FIG. 8, the substrate 100 may include a glass material or polymer resins. The polymer resins may include polyether sulfone, polyacrylate, polyether imide, polyethylene naphthalate, PET, polyphenylene sulfide, polyarylate, PI, polycarbonate, cellulose acetate propionate, or the like. The substrate 100 including the polymer resins may be flexible, rollable, or bendable. The substrate 100 may have a multi-layered structure including a polymer resins layer and an inorganic layer (not shown).

A buffer layer 110 may reduce or block penetration of impurities, moisture, or external materials from below the substrate 100 and may provide a flat surface over the substrate 100. The buffer layer 110 may include an inorganic insulating material, such as silicon oxide, silicon oxynitride, and silicon nitride, and may include a single layer or multiple layers including one or more of the inorganic insulating materials described above.

The conductive layer BML may be arranged between the substrate 100 and the pixel circuit PC, for example, between the substrate 100 and the buffer layer 110. The conductive layer BML may at least partially overlap the transistors TFT.

The conductive layer BML may have the opening BML_OP corresponding to the transmission area TA. The opening BML_OP of the conductive layer BML may have a substantially polygonal, circular, or cross shape in a plan view and may have concave and convex edge portions.

The conductive layer BML may include a lower conductive layer 105a and an upper conductive layer 105b. The lower conductive layer 105a may have a first opening 105a_OP corresponding to the transmission area TA, and the upper conductive layer 105b may have a second opening 105b_OP corresponding to the transmission area TA.

The conductive layer BML may include Al, Pt, Pd, Ag, Mg, Au, Ni, Nd, Ir, Cr, Ca, Mo, Ti, W, Cu, ITO, IZO, ZnO, In$_2$O$_3$, IGO, and/or AZO. The lower conductive layer 105a of the conductive layer BML may include at least one of Ti, Cr, ITO, IZO, ZnO, In$_2$O$_3$, IGO, and AZO, and the upper conductive layer 105b of the conductive layer BML may include Mo.

The pixel circuit PC including the transistor TFT and the storage capacitor Cst may be arranged on the buffer layer 110. The transistor TFT may include a semiconductor layer ACT, may include a gate electrode GE overlapping a channel area of the semiconductor layer ACT, and may include a source electrode SE and a drain electrode DE connected to a source area and a drain area of the semiconductor layer ACT, respectively.

Inorganic insulating layers IIL may be arranged in the pixel circuit PC. The buffer layer 110 may be arranged between the conductive layer BML and the semiconductor layer ACT, a gate insulating layer 111 may be arranged between the semiconductor layer ACT and the gate electrode GE, and a first interlayer insulating layer 113 and a second interlayer insulating layer 115 may be arranged between the gate electrode GE and the source electrode SE and/or between the gate electrode GE and the drain electrode DE.

Each of the inorganic insulating layers IIL may have an opening IIL_OP corresponding to the transmission area TA. The buffer layer 110 may have a third opening 110OP corresponding to the transmission area TA, the gate insulating layer 111 may have a fourth opening 111OP corresponding to the transmission area TA, the first interlayer insulating layer 113 may have a fifth opening 113OP corresponding to the transmission area TA, and the second interlayer insulating layer 115 may have a sixth opening 115OP corresponding to the transmission area TA.

The opening IIL_OP of the inorganic insulating layer IIL may have substantially polygonal, oval, circular, or cross shape in a plan view and may have concave and convex edge portions.

The storage capacitor Cst may overlap the transistor TFT. The storage capacitor Cst may include the lower electrode CE1 and the upper electrode CE2 overlapping each other. The gate electrode GE of the transistor TFT may include/ share the lower electrode CE1 of the storage capacitor Cst. The gate electrode GE of the transistor TFT may function as the lower electrode CE1 of the storage capacitor Cst. The first interlayer insulating layer 113 may be arranged between the lower electrode CE1 and the upper electrode CE2.

The semiconductor layer Act may include polysilicon. The semiconductor layer ACT may include amorphous silicon. The semiconductor layer ACT may include an oxide of at least one of In, Ga, Sn, Zr, V, Hf, Cd, Ge, Cr, Ti, and Zn. The semiconductor layer ACT may include a channel area, a source area, and a drain area, wherein the source area and the drain area may be doped with impurities.

The gate insulating layer 111 may include an inorganic insulating material, such as silicon oxide, silicon oxynitride, and silicon nitride, and may include a single layer or multiple layers.

The gate electrode GE or the lower electrode CE1 may include a low resistance conductive material, such as Mo, Al, Cu, and/or Ti and may have a single layer or multiple layers.

The first interlayer insulating layer 113 may include an inorganic insulating material, such as silicon oxide, silicon oxynitride, and silicon nitride, and may include a single layer or multiple layers.

The upper electrode CE2 may include Al, Pt, Pd, Ag, Mg, Au, Ni, Nd, Ir, Cr, Ca, Mo, Ti, W, and/or Cu and may include a single layer or multiple layers.

The second interlayer insulating layer 115 may include an inorganic insulating material, such as silicon oxide, silicon oxynitride, and silicon nitride, and may include a single layer or multiple layers.

The source electrode SE or the drain electrode DE may include Al, Pt, Pd, Ag, Mg, Au, Ni, Nd, Ir, Cr, Ca, Mo, Ti, W, and/or Cu and may include a single layer or multiple layers. The source electrode SE or the drain electrode DE may have a triple-layered structure including a Ti layer, an Al layer, and a Ti layer. Each of source electrode SE and the drain electrode DE may be electrically connected to the semiconductor layer ACT through a corresponding contact hole CNT formed in the at least one inorganic insulating layer IIL.

A planarization insulating layer 117 may include a material different from a material of at least one of the inorganic insulating layers IIL, such as the gate insulating layer 111, the first interlayer insulating layer 113, and/or the second interlayer insulating layer 115. The planarization insulating layer 117 may include an organic insulating material, such as acryl, benzocyclobutene (BCB), PI, hexamethyldisiloxane (HMDSO), etc.

A pixel electrode 221 may be formed on the planarization insulating layer 117. The pixel electrode 221 may be electrically connected to the transistor TFT through a contact hole formed in the planarization insulating layer 117.

The pixel electrode 221 may include a reflective layer including Ag, Mg, Al, Pt, Pd, Au, Ni, Nd, Ir, Cr, or an alloy or combination of some of the metals. The pixel electrode 221 may include a reflective layer and one or more transparent conductive layers arranged above and/o below the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). The pixel electrode 221 may have a triple-layered structure in which an ITO layer, an Ag layer, and an ITO layer are sequentially stacked.

A pixel-defining layer 119 may cover an edge of the pixel electrode 221 and may include a hole 119TH exposing the center of the pixel electrode 221. The pixel-defining layer 119 may include an organic insulating material, such as BCB, PI, HMDSO, or the like. The hole 119TH of the pixel-defining layer 119 may define an emission area EA, and red, green, or blue light may be emitted through the emission area EA. An area or a width of the emission area EA may represent an area or a width of a pixel.

A spacer 121 may be formed on the pixel-defining layer 119. The spacer 121 may prevent damage to layers below the spacer 121 due to a mask in a process of forming an intermediate layer 222, etc. The spacer 121 may include the same material as the pixel-defining layer 119.

The intermediate layer 222 may include an emission layer 222b overlapping the pixel electrode 221. The emission layer 222b may include an organic material. The emission layer 222b may include a high molecular-weight organic material or a low molecular-weight organic material emitting certain color light. The emission layer 222b may be formed using a deposition process using a mask.

A first functional layer 222a and a second functional layer 222c may be arranged below and/or above the emission layer 222b.

The first functional layer 222a may include a single layer or multiple layers. For example, when the first functional layer 222a includes a high molecular-weight material, the first functional layer 222a may include a hole transport layer (HTL) having a single-layered structure and may include poly-(3,4)-ethylene-dihydroxy thiophene (PEDOT) or polyaniline (PANI). When the first functional layer 222a includes a small molecular-weight material, the first functional layer 222a may include a hole injection layer (HIL) and an HTL.

When the first functional layer 222a and the emission layer 222b include a high molecular-weight material, it may be desirable to form the second functional layer 222c. The second functional layer 222c may include a single layer or multiple layers. The second functional layer 222c may include an electron transport layer (ETL) and/or an electron injection layer (EIL).

The first functional layer 222a and the second functional layer 222c may be formed as one body to completely cover a display area.

The opposite electrode 223 may include a conductive material having a relatively low work function. The opposite electrode 223 may include a semi-transparent or transparent layer including Ag, Mg, Al, Ni, Cr, Li, Ca, or an alloy of some of the metals. The opposite electrode 223 may further include a layer, such as ITO, IZO, ZnO, or $In_2O_3$, on the metal or alloy layer. The opposite electrode 223 may include Ag and Mg.

A capping layer 224 including an organic material may be formed on the opposite electrode 223. The capping layer 224 may protect the opposite electrode 223 and may increase light extraction efficiency. The capping layer 224 may include an organic material having a higher refractive index than a material of the opposite electrode 223. The capping layer 224 may include stacked layers having different refractive indices. The capping layer 224 may include a high refractive index layer, a low refractive index layer, and a high refractive index layer that are stacked. A refractive index of the high refractive index layer may be equal to or higher than 1.7; a refractive index of the low refractive index layer may be equal to or lower than 1.3. The capping layer 224 may additionally include LiF. The capping layer 224 may additionally include at least one of $SiO_2$, $SiN_X$, and $SiO_XN_Y$. The capping layer 224 may be optional.

Each of the first functional layer 222a, the second functional layer 222c, the opposite electrode 223, and the capping layer 224 may have an opening to correspond to the transmission area TA. The first functional layer 222a, the second functional layer 222c, the opposite electrode 223, and the capping layer 224 may not cover the transmission area TA. Thus, the light transmittance in the transmission area TA may be desirable.

A stack including the pixel electrode 221, the intermediate layer 222, the opposite electrode 223, and the capping layer 224 may form a light-emitting diode, for example, an organic light-emitting diode OLED. The display layer DISL including the pixel circuit PC, the insulating layers, and the organic light-emitting diode OLED may be covered by a thin-film encapsulation layer 300.

The thin-film encapsulation layer 300 may include a first inorganic encapsulation layer 310, a second inorganic encapsulation layer 330, and an organic encapsulation layer 320 between the inorganic encapsulation layers 310 and 330.

Each of the inorganic encapsulation layers 310 and 330 may include at least one inorganic insulating material. The inorganic insulating material may include aluminum oxide, titanium oxide, tantalum oxide, hafnium oxide, zinc oxide, silicon oxide, silicon nitride, or/and silicon oxynitride. The inorganic encapsulation layers 310 and 330 may be formed by using chemical vapor deposition (CVD).

The organic encapsulation layer 320 may include a polymer-based material. The polymer-based material may include an acryl-based resin, an epoxy-based resin, PI, polyethylene, etc. The organic encapsulation layer 320 may include an acryl-based resin, for example, polymethacrylate, polyacrylic acid, etc. The organic encapsulation layer 320 may be formed by curing a monomer or coating a polymer.

The component area CA includes a transmission area TA between two pixel circuits PC and between two organic light-emitting diodes OLED.

Insulating layers on the substrate 100, for example, the at least one inorganic insulating layer IIL, the planarization insulating layer 117, and the pixel-defining layer 119 each may include an opening that corresponds to the transmission area TA. The at least one inorganic insulating layer IIL may include one or more of the buffer layer 110, the gate insulating layer 111, the first interlayer insulating layer 113, and the second interlayer insulating layer 115.

The opening IIL_OP of the at least one inorganic insulating layer IIL, an opening 117OP of the planarization insulating layer 117, and an opening 119OP of the pixel-defining layer 119 may expose and/or correspond to one another in the transmission area TA.

The opening IIL_OP of the at least one inorganic insulating layer IIL may be a through-hole penetrating a stack of the gate insulating layer 111, the first interlayer insulating layer 113, and the second interlayer insulating layer 115 or may be a blind hole in which a portion of the inorganic insulating layers IIL is removed along a thickness direction of the stack of the gate insulating layer 111, the first interlayer insulating layer 113, and the second interlayer insulating layer 115. Each of the opening 117OP of the planarization insulating layer 117 and the opening 119OP of the pixel-defining layer 119 may be a through-hole. The opening IIL_OP of the at least one inorganic insulating layer IIL, the opening 117OP of the planarization insulating layer 117, and the opening 119OP of the pixel-defining layer 119 may have different sizes or widths from one another.

Figure 9:
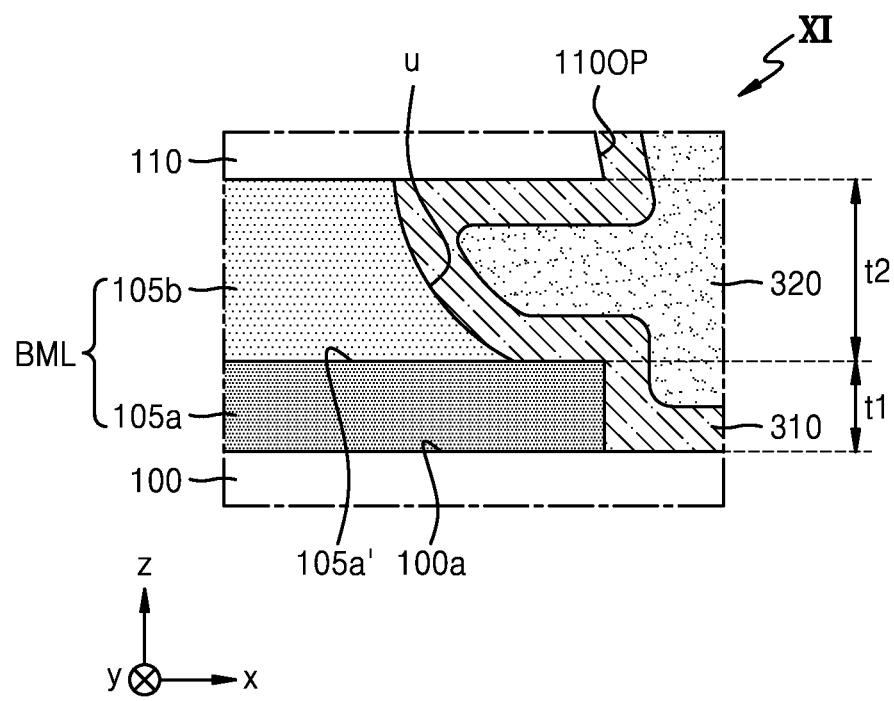
FIG. 9 is a cross-sectional view schematically illustrating a portion of a display apparatus according to an embodiment.

FIG. 9 is a cross-sectional view schematically illustrating a portion of a display apparatus according to an embodiment.

Referring to FIG. 9, the conductive layer BML may include the lower conductive layer 105a and the upper conductive layer 105b. The conductive layer BML may be arranged on the substrate 100 and may have an undercut structure u. The upper conductive layer 105b of the conductive layer BML may have the undercut structure u. The undercut structure u of the upper conductive layer 105b may be formed when the upper conductive layer 105b arranged in the transmission area TA and a material for forming the pixel electrode 221 (illustrated in FIG. 8) are etched substantially simultaneously in a same process step.

The conductive layer BML may be arranged directly on an upper surface 100a of the substrate 100. The lower conductive layer 105a of the conductive layer BML may be arranged directly on the upper surface 100a of the substrate 100. The buffer layer 110 may be arranged on an upper surface of the upper conductive layer 105b.

The lower conductive layer 105a of the conductive layer BML may have a first thickness t1 from the upper surface 100a of the substrate 100. The upper conductive layer 105b of the conductive layer BML may have a second thickness t2 from an upper surface 105a' of the lower conductive layer 105a. The second thickness t2 may be greater than the first thickness t1. The first thickness t1 may be in a range of about 100 Å to about 500 Å, and the second thickness t2 may be in a range of about 2000 Å to about 4000 Å.

Figure 10:
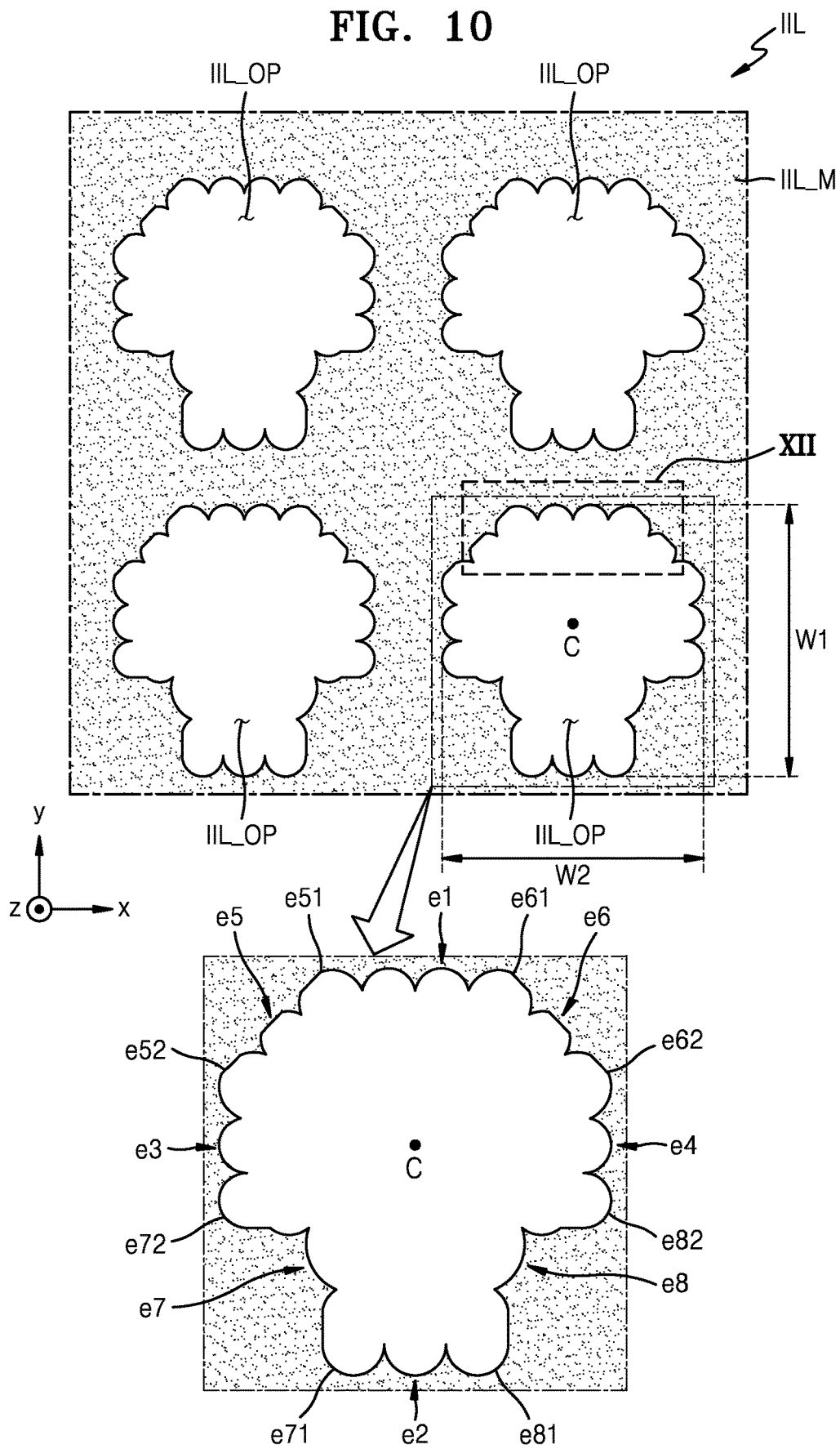
FIG. 10 is a plan view schematically illustrating an insulating layer of a display apparatus according to an embodiment.
Figure 11A:
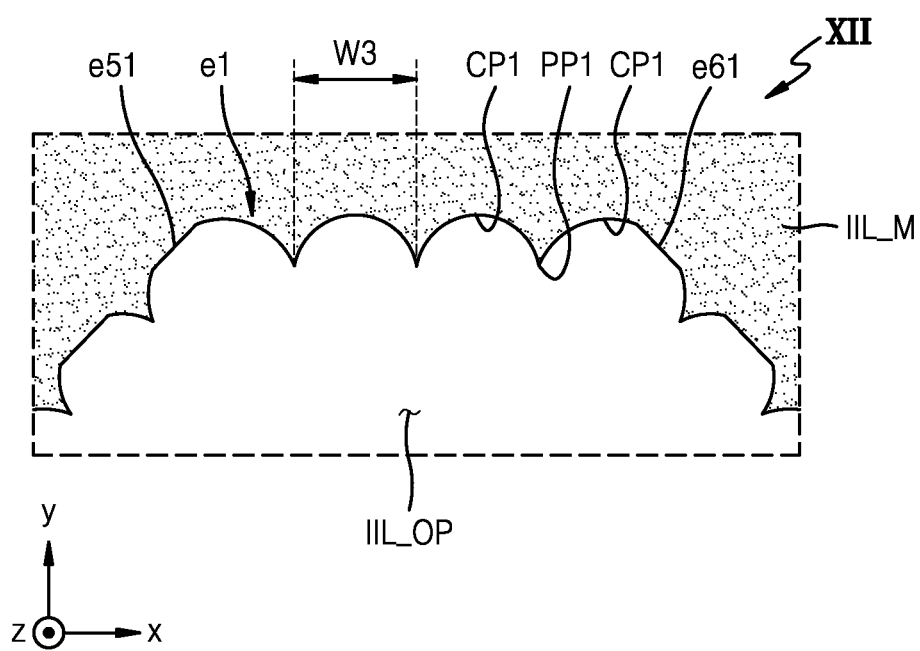
FIG. 11A is a plan view schematically illustrating region XII of FIG. 10 according to an embodiment.
Figure 11B:
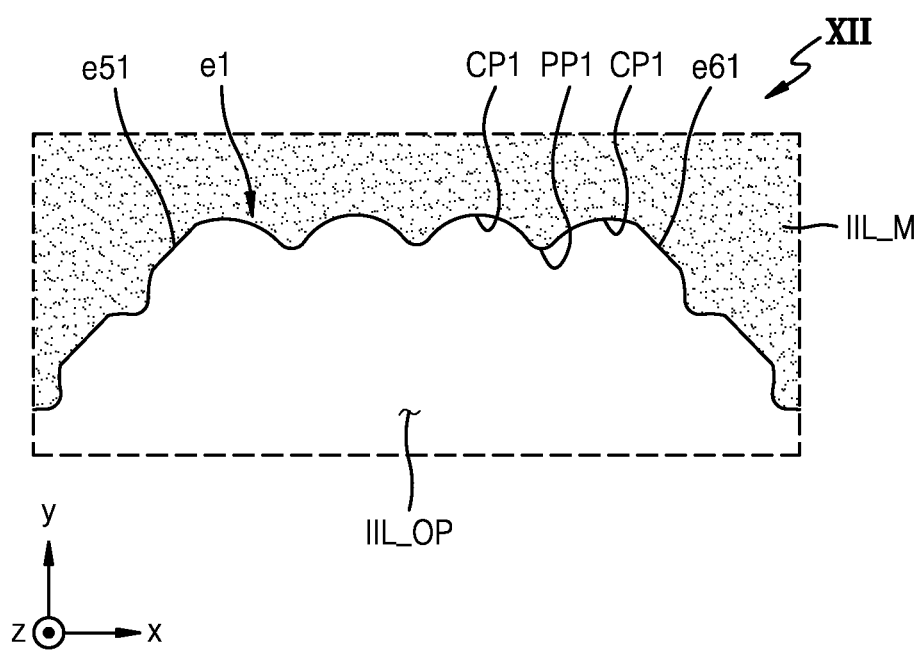
FIG. 11B is a plan view schematically illustrating region XII of FIG. 10 according to an embodiment.

FIG. 10 is a plan view schematically illustrating an insulating layer of a display apparatus according to an embodiment, and FIGS. 11A and 11B are plan views schematically illustrating region XII of FIG. 10 according to embodiments.

Referring to FIG. 10, the inorganic insulating layer IIL may include openings IIL_OP spaced from each other. The openings IIL_OP of the inorganic insulating layer IIL may be spaced from each other in a ±x direction (or a row direction) and a ±y direction (or a column direction), and each opening IIL_OP may be completely surrounded by an insulating material portion IIL_M.

FIG. 10 illustrates that the openings IIL_OP are arranged in the ±x direction (or the row direction) and the ±y direction (or the column direction). In an embodiment, the openings IIL_OP may be arranged in a zigzag pattern.

An opening IIL_OP of the inorganic insulating layer IIL may generally have a polygonal shape in a plan view. The opening IIL_OP may have a center C.

The opening IIL_OP may include a first edge portion e1 and a second edge portion e2 spaced from each other in the ±y direction and may include a third edge portion e3 and a fourth edge portion e4 spaced from each other in the ±x direction. The center C of the opening IIL_OP may be positioned between the edge portions e1 and e2 and between the edge portions e3 and e4. The term "edge" may mean "perimeter."

The opening IIL_OP may further include fifth through eighth edge portions e5 through e8. The fifth edge portion e5 may include a first end e51 connected to the first edge portion e1 and a second end e52 connected to the third edge portion e3. The sixth edge portion e6 may include a first end e61 connected to the first edge portion e1 and a second end e62 connected to the fourth edge portion e4. The seventh edge portion e7 may include a first end e71 connected to the second edge portion e2 and a second end e72 connected to the third edge portion e3. The eighth edge portion e8 may include a first end e81 connected to the second edge portion e2 and a second end e82 connected to the fourth edge portion e4. The seventh edge portion e7 and the eighth edge portion e8 may be recessed in a direction toward an inner part of the opening IIL_OP and/or the center C of the opening IIL_OP as illustrated in FIG. 10.

The edge of the opening IIL_OP may include uneven edge portions that are concave and convex. Recesses (or concave edge portions) of the opening IIL_OP may correspond to protrusions (or convex edge portions) of the inorganic insulating layer IIL. Protrusions (or convex edge portions) of the opening IIL_OP may correspond to recesses (or concave edge portions) of the inorganic insulating layer IIL. As illustrated in FIGS. 10, 11A, and 11B, the edge of the opening IIL_OP may have consecutive first convex portions CP1 that are convex away from the center C and/or inner part of the opening IIL_OP, protrude toward outer edges (or an outer perimeter) of the inorganic insulating layer IIL, and respectively correspond to consecutive recesses of the inorganic insulating layer IIL. The first convex portions CP1 may be consecutively and/or regularly arranged. First concave portions PP1 may be concave toward the center C and/or inner part of the opening IIL_OP, may be arranged between immediately neighboring first convex portions CP1, and may correspond to protrusions of the inorganic insulating layer IIL that protrude toward the center C and/or inner part of the opening IIL_OP. The first concave portions PP1 may have a relatively sharp shape/structure as illustrated in FIG. 11A or a relatively round shape/structure as illustrated in FIG. 11B.

A width W3 (or third width) of the first convex portion CP1 may be less than or equal to about 10% of a maximum width/length W1 (or first width) of the opening IIL_OP in the ±y direction and/or a maximum width/length W2 (or second width) of the opening IIL_OP in the ±x direction. The third width W3 may be in a range of about 5% to about 10% of the first width W1 and/or the second width W2.

The first convex portion CP1 may have a substantially semi-circular shape as illustrated in FIGS. 11A and 11B. The first convex portion CP1 may have one or more of various shapes, such as a substantially semi-oval shape, a substantially circular shape, or a substantially square shape.

When the edge of the opening IIL_OP (or an edge of the insulating material portion IIL_M defining the opening IIL_OP) includes the plurality of first convex portions CP1 (or corresponding recesses of the inorganic insulating layer 114 diffraction of light that is transmitted toward a component through the opening IIL_OP may be minimized. Advantageously, the light received by the component may enable sufficient image resolution.

The characteristics about the first edge portion e1 of the opening IIL_OP described with reference to FIGS. 11A and 11B may be applicable to one or more of the other edge portions e2 to e8 of the opening IIL_OP. The characteristics about the edge of the opening IIL_OP described with reference to FIGS. 11A and 11B may be applied to all of the first through eighth edge portions e1 through e8. The second through eight edge portions e2 through e8 of the opening IIL_OP may also have the structure of one or more first convex portions CP1 that are consecutively and/or regularly arranged.

The opening IIL_OP may be defined by the edge of the insulating material portion IIL_M of the inorganic insulating layer IIL. Thus, the concave and convex edge portions of the opening IIL_OP may correspond to the convex and concave edge portions of the insulating material portion IIL_M.

The openings IIL_OP of the inorganic insulating layer IIL each may define the transmission area TA (FIG. 7). Thus, a planar shape of the transmission area TA may be substantially the same as a planar shape of the opening IIL_OP of the inorganic insulating layer IIL.

Figure 12:
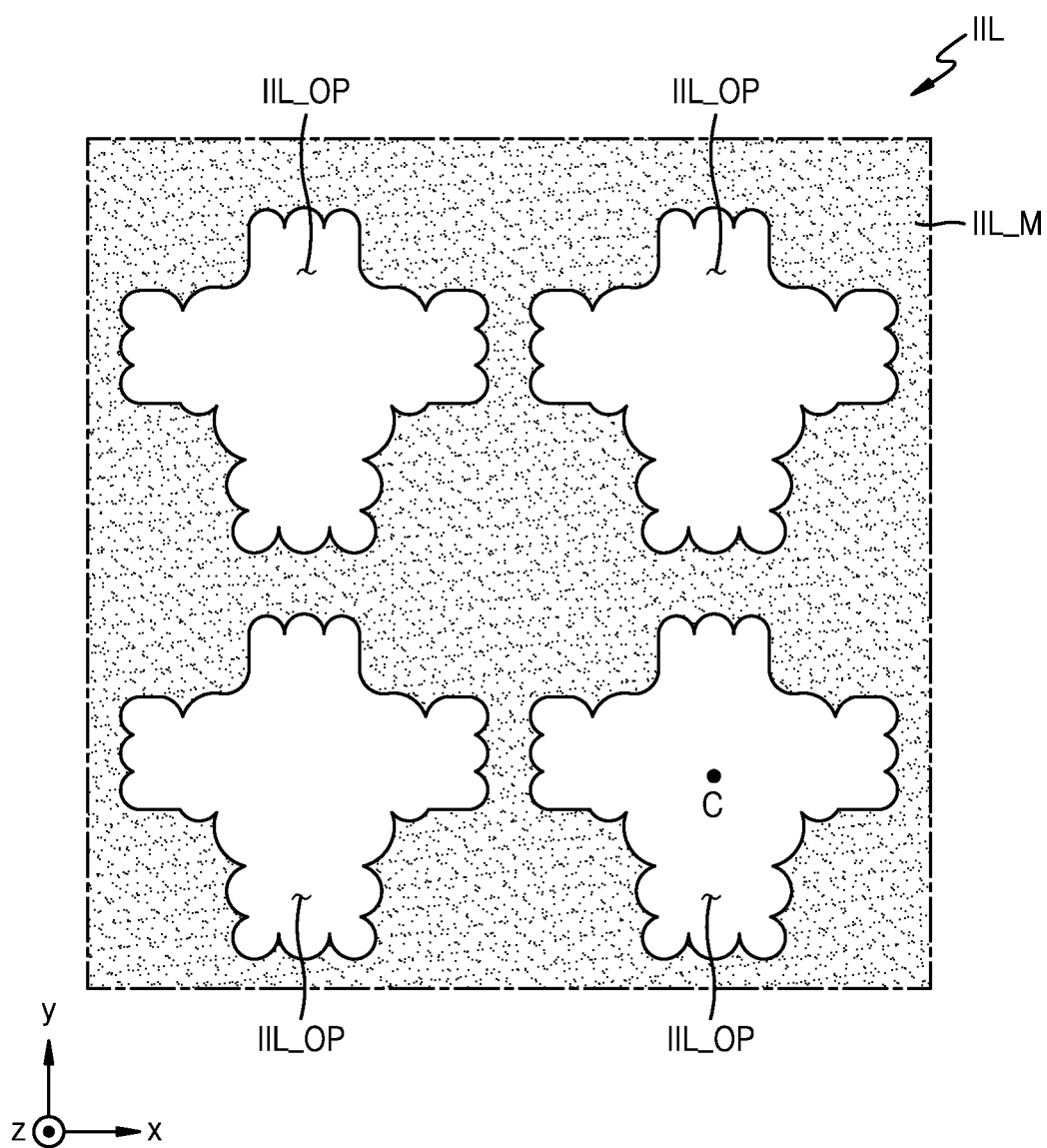
FIG. 12 is a plan view schematically illustrating an insulating layer of a display apparatus according to an embodiment.
Figure 13:
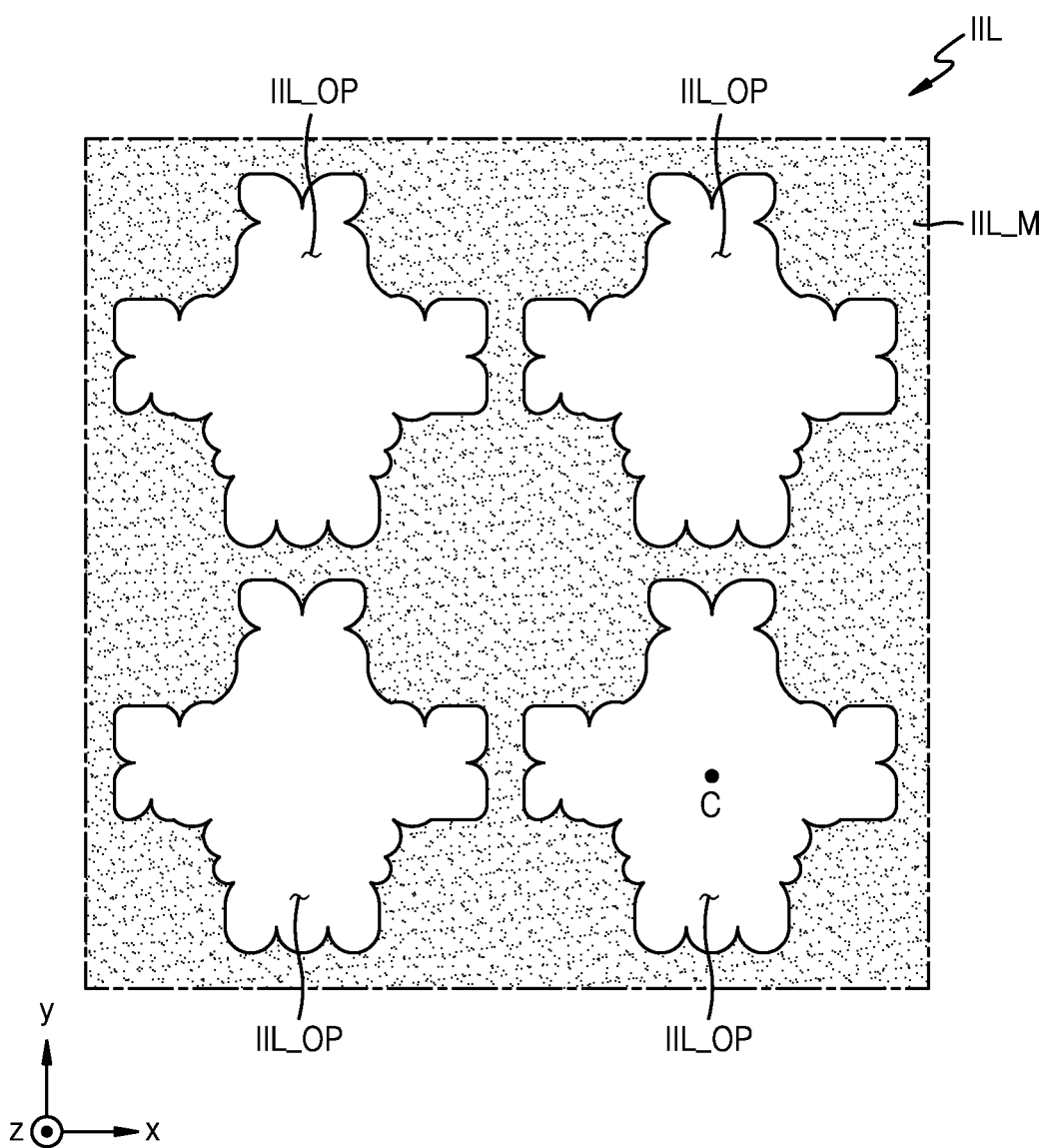
FIG. 13 is a plan view schematically illustrating an insulating layer of a display apparatus according to an embodiment.

FIGS. 12 and 13 are plan views schematically illustrating an insulating layer of a display apparatus according to an embodiment.

As illustrated in FIGS. 12 and 13, the inorganic insulating layer IIL may include the openings IIL_OP, wherein an edge of each opening IIL_OP may include concave portions and convex portions. The opening IIL_OP of the inorganic insulating layer IIL illustrated in FIGS. 12 and 13 may have a substantially cross shape, in which each of an upper edge portion, a lower edge portion, a right edge portion, and a left edge portion may include concave edge portions that are concave toward a center C or inner part of the opening IIL_OP.

As illustrated in FIGS. 12 and 13, a length of the upper edge portion may be less than a length of the lower edge portion. The length of the upper edge portion and the length of the lower edge portion may be equal to each other, or the length of the upper edge portion may be greater than the length of the lower edge portion. The characteristics about the concave portions and the convex portions may be analogous to or identical to those described with reference to FIGS. 10 through 11B.

Widths of the convex/concave portions or the number of convex/concave portions included in different edge portions may be different. The upper edge portion may include three convex portions (and two concave portions) as illustrated in FIG. 12, or the upper edge portion may include four convex portions (or three concave portions) as illustrated in FIG. 13. A width/length of the convex portion illustrated in FIG. 12 may be less than a width/length of a convex portion illustrated in FIG. 13.

Figure 14:
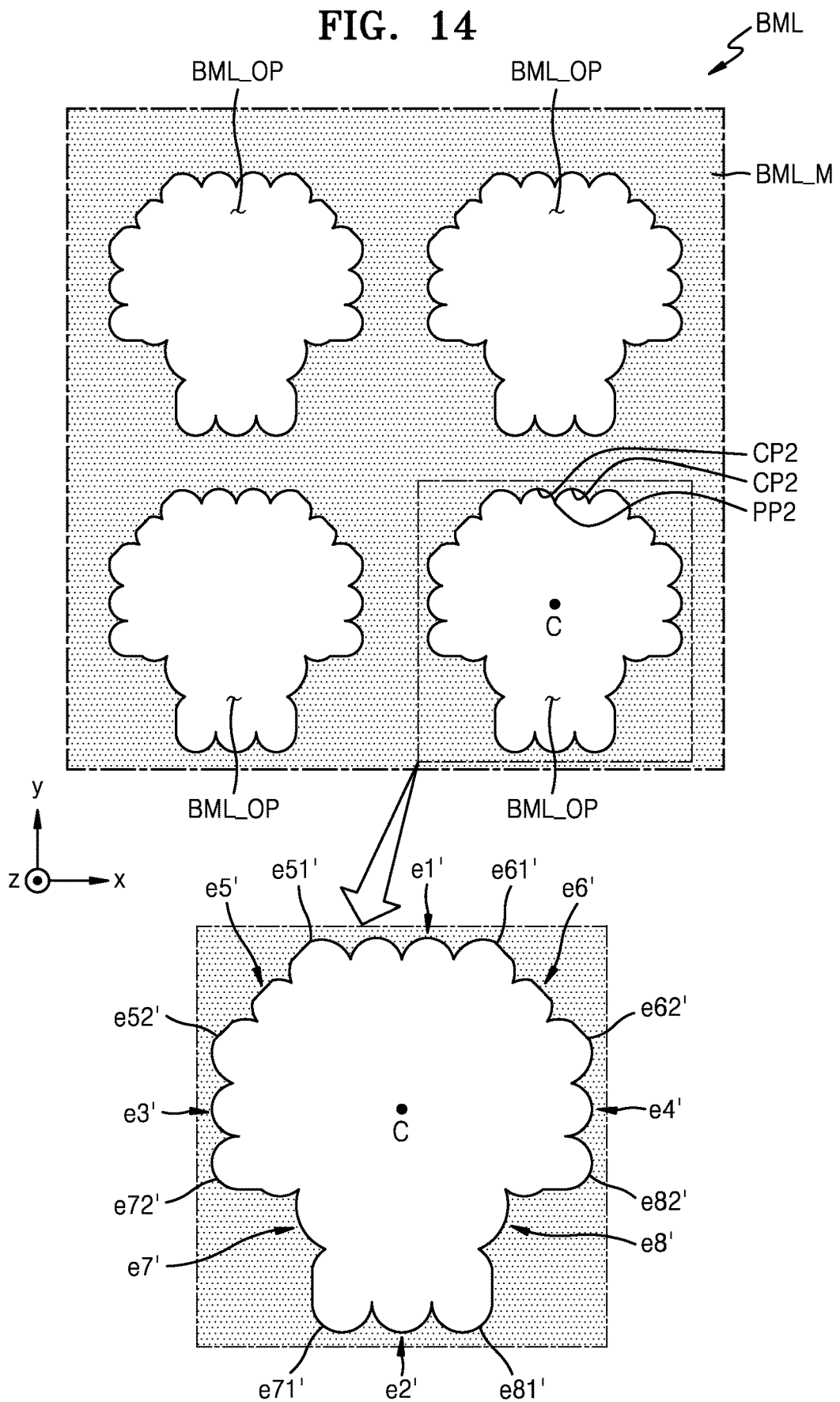
FIG. 14 is a plan view schematically illustrating a conductive layer of a display apparatus according to an embodiment.

FIG. 14 is a plan view schematically illustrating the conductive layer BML of a display apparatus according to an embodiment.

Referring to FIG. 14, the conductive layer BML may include openings BML_OP spaced from each other. The openings BML_OP of the conductive layer BML may be spaced from each other in a ±x direction (or a row direction) and a ±y direction (or a column direction), and each of the openings BML_OP may be completely surrounded by a metal material portion BML_M.

FIG. 14 illustrates that the openings BML_OP are arranged in the ±x direction (or the row direction) and the ±y direction (or the column direction). In an embodiment, the openings BML_OP may be arranged in a zigzag pattern.

An opening BML_OP of the conductive layer BML may generally have a polygonal shape in a plan view. The opening BML_OP may have a center C.

The opening BML_OP may include a first edge portion e1' and a second edge portion e2' spaced from each other in the ±y direction and may include a third edge portion e3' and a fourth edge portion e4' spaced from each other in the ±x direction. The center C of the opening IIL_OP may be positioned between the edge portions e1' and e2' and between the edge portions e3' and e4'. The term "edge" may mean "perimeter."

The opening BML_OP may further include fifth through eighth edge portions e5' through e8'. The fifth edge portion e5' may include a first end e51' connected to the first edge portion e1' and a second end e52' connected to the third edge portion e3'. The sixth edge portion e6' may include a first end e61' connected to the first edge portion e1' and a second end e62' connected to the fourth edge portion e4'. The seventh edge e7' may include a first end e71' connected to the second edge portion e2' and a second end e72' connected to the third edge portion e3', and the eighth edge e8' may include a first end e81' connected to the second edge portion e2' and a second end e82' connected to the fourth edge portion e4'. The seventh edge portion e7' and the eighth edge portion e8' may be recessed in a direction toward an inner part and/or of the opening BML_OP the center C of the opening BML_OP as illustrated in FIG. 14.

The edge of the opening BML_OP may include uneven edge portions that are concave and convex. Recesses (or concave edge portions) of the opening BML_OP may correspond to protrusions (or convex edge portions) of the conductive layer BML. Protrusions (or convex edge portions) of the opening BML_OP may correspond to recesses (or concave edge portions) of the conductive layer BML. As illustrated in FIG. 14, the edge of the opening BML_OP may have consecutive second convex portions CP2 that are convex in a direction spaced from the center C and/or inner part of the opening BML_OP, protrude toward outer edges (or an outer perimeter) of the conductive layer BML, and respectively correspond to consecutive recesses of the conductive layer BML. The second convex portions CP2 may be continually and/or regularly arranged. Second concave portions PP2 may be concave toward the center C and/or inner part of the opening BML_OP, may be arranged between immediately neighboring second convex portions CP2, and may correspond to protrusions of the conductive layer BML that protrude toward the center C and/or inner part of the opening BML_OP. The second concave portions PP2 may have a relatively sharp shape/structure as portions PP1 illustrated in FIG. 11A or a relatively round shape/structure as portions PP1 illustrated in FIG. 11B.

The second convex portion CP2 may have substantially a semi-circular shape as illustrated in FIG. 14. The second convex portion CP2 may have one or more of various shapes, such as a substantially semi-oval shape, a substantially circular shape, or a substantially square shape.

When the edge of the opening BML_OP (or an edge of the metal material portion BML_M defining the opening BML_OP) includes the plurality of second convex portions CP2 (or corresponding recesses of the conductive layer BML), diffraction of light that is transmitted toward a component through the opening BML_OP may be minimized. Advantageously, the light received by the component may enable sufficient image resolution.

The opening BML_OP may be defined by the edge of the metal material portion BML_M of the conductive layer BML. Thus, the concave and convex edge portions of the opening BML_OP may correspond to the convex and concave edge portions of the metal material portion BML_M.

The openings BML_OP of the conductive layer BML each may define the transmission area TA (FIG. 7). Thus, a planar shape of the transmission area TA may be substantially the same as a planar shape of the opening BML_OP of the conductive layer BML.

Figure 15A:
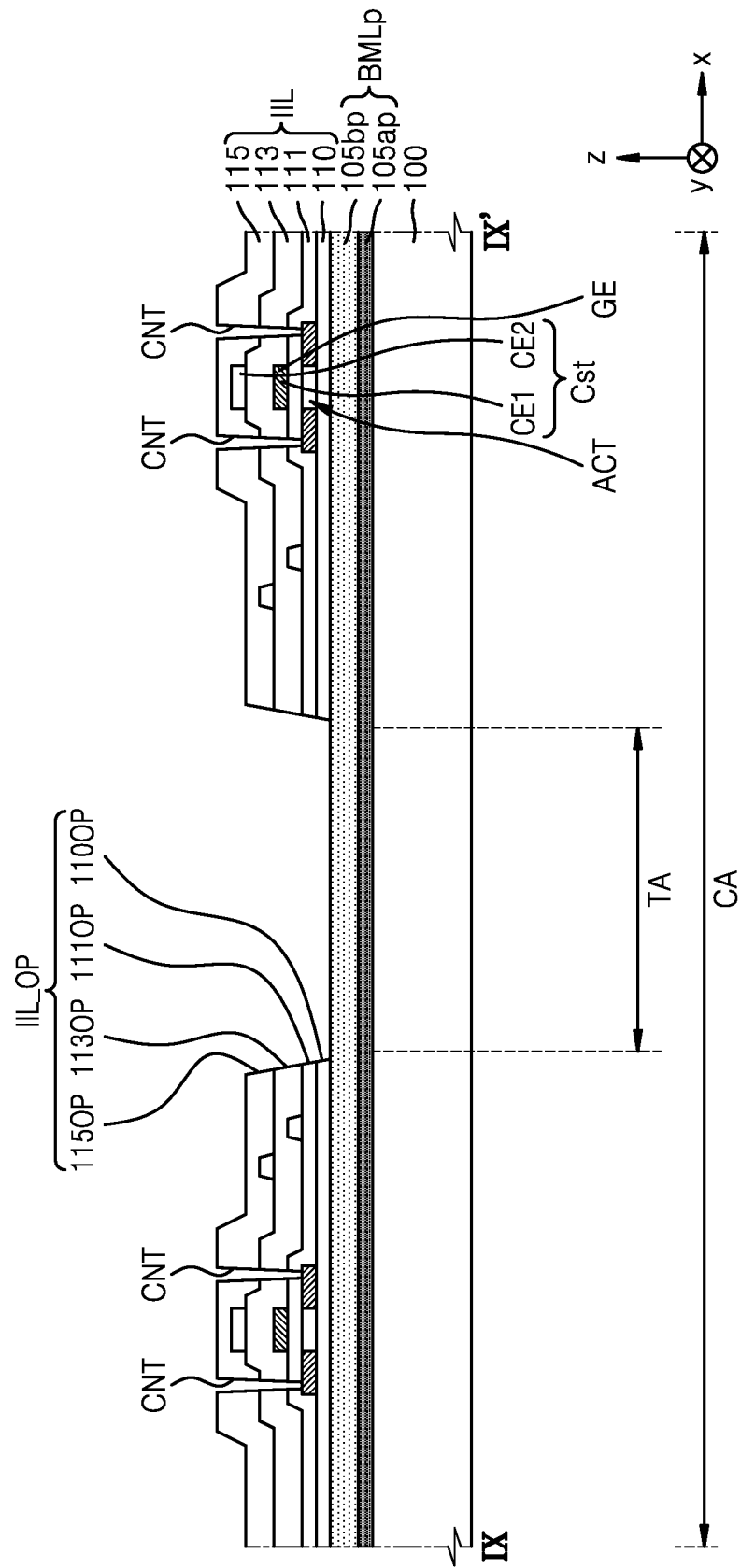
FIG. 15A, FIG. 15B, FIG. 15C, FIG. 15D, and FIG. 15E are cross-sectional views illustrating structures formed in a method of manufacturing a display apparatus according to an embodiment.
Figure 15B:
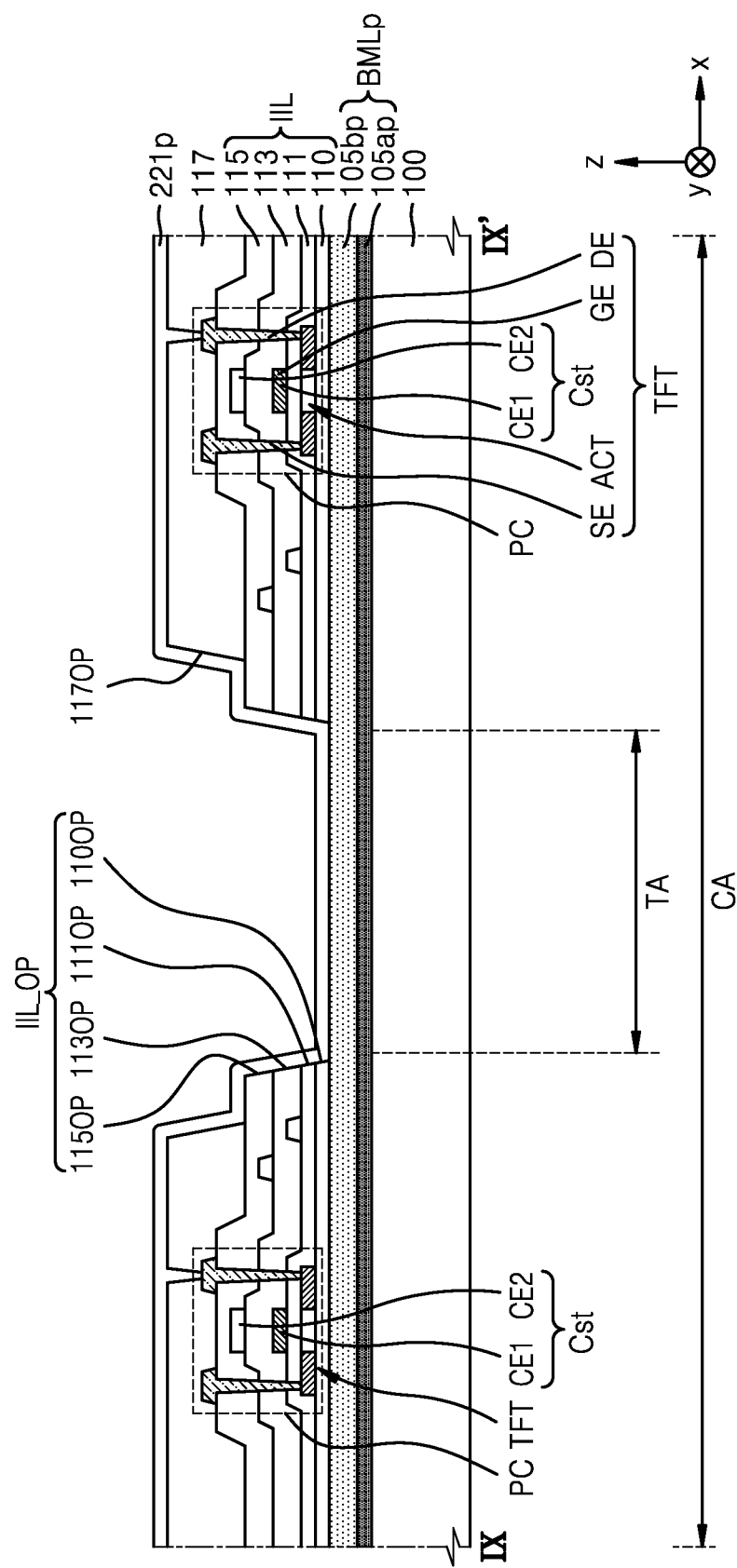
Figure 15C:
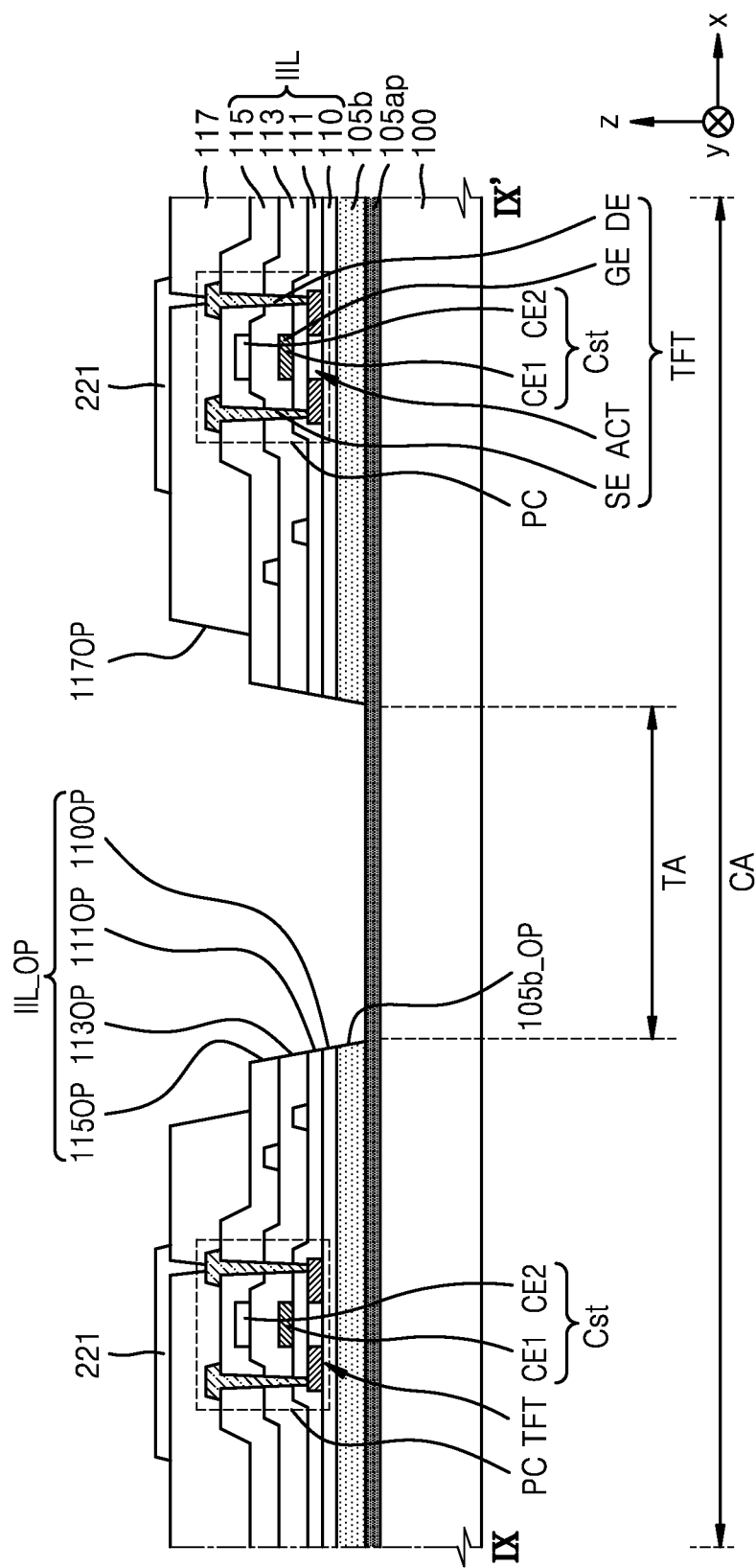

Referring to FIG. 15C, the opening BML_OP of the conductive layer BML may be formed using the inorganic insulating layer IIL as an etch mask. Thus, the planar shape of the opening BML_OP of the conductive layer BML may be substantially identical/similar to a planar shape of the opening IIL_OP of the inorganic insulating layers IIL. The configurations about the opening IIL_OP of the inorganic insulating layer IIL illustrated in FIGS. 10 through 13 may be substantially applicable to the opening BML_OP of the conductive layer BML.

Features associated with the display apparatus may be applicable to a method of manufacturing the display apparatus.

FIGS. 15A through 15E are cross-sectional views illustrating structures formed in a method of manufacturing a display apparatus according to an embodiment. The display apparatus is described with reference to at least FIG. 8.

Referring to FIG. 15A, the substrate 100 (on which the transmission area TA is defined) may be prepared. Subsequently, a conductive material layer BMLp may be formed on an upper surface of the substrate 100.

The forming of the conductive material layer BMLp may include sequentially forming a first conductive material layer 105$ap$ and a second conductive material layer 105$bp$. A thickness of the second conductive material layer 105$bp$ may be greater than a thickness of the first conductive material layer 105$ap$.

The conductive material layer BMLp may include Al, Pt, Pd, Ag, Mg, Au, Ni, Nd, Ir, Cr, Ca, Mo, Ti, W, Cu, ITO, IZO, ZnO, $In_2O_3$, IGO, and/or AZO. The first conductive material layer 105$ap$ of the metal layer 105 may include at least one of Ti, Cr, ITO, IZO, ZnO, $In_2O_3$, IGO, and AZO, and the second conductive material layer 105$bp$ may include Mo.

After the conductive material layer BMLp is formed on the upper surface of the substrate 100, the semiconductor layer ACT, the gate electrode GE, and the storage capacitor Cst may be formed on the conductive material layer BMLp. The inorganic insulating layer IIL may be formed between or on the semiconductor layer ACT, the gate electrode GE, and the storage capacitor Cst. Referring to FIG. 15A, the buffer layer 110 may be formed between the conductive material layer BMLp and the semiconductor layer ACT, the gate insulating layer 111 may be formed between the semiconductor layer ACT and the gate electrode GE, the first interlayer insulating layer 113 may be formed between the lower electrode CE1 and the upper electrode CE2, and the second interlayer insulating layer 115 may be formed on the upper electrode CE2.

Next, the contact holes CNT (exposing at least a portion of the semiconductor layer ACT) and the opening IIL_OP (corresponding to the transmission area TA) may be formed by etching the inorganic insulating layer IIL. The contact holes CNT may be formed by removing a portion of each of the gate insulating layer 111, the first interlayer insulating layer 113, and the second interlayer insulating layer 115. The third opening 110OP may be formed by removing a portion of the buffer layer 110 that corresponds to the transmission area TA. The fourth opening 111OP may be formed by removing a portion of the gate insulating layer 111 that corresponds to the transmission area TA. The fifth opening 113OP may be formed by removing a portion of the first interlayer insulating layer 113 that corresponds to the transmission area TA. The sixth opening 115OP may be formed by removing a portion of the second interlayer insulating layer 115 that corresponds to the transmission area TA.

Referring to FIGS. 10 through 13, the opening IIL_OP of the inorganic insulating layer IIL may have a substantially polygonal, oval, circular, or cross shape In a plan view and may have an edge/perimeter that includes concave and convex portions. The edge of the opening IIL_OP of the inorganic insulating layer IIL may include convex portions that are convex toward edges of the inorganic insulating layer IIL, wherein concave portions may be provided between the convex portions.

Next, referring to FIG. 15B, the source electrode SE and the drain electrode DE may be formed on the second interlayer insulating layer 115. A portion of each of the source electrode SE and the drain electrode DE may not be exposed by a corresponding one of the contact holes CNT and may be directly and electrically connected to the semiconductor layer ACT.

After the source electrode SE and the drain electrode DE are formed, the planarization layer 117 having the opening 117OP corresponding to the transmission area TA may be formed, and a pixel electrode material layer 221*p* may be formed on the planarization layer 117.

The pixel electrode material layer 221*p* may be formed on the entire surface of the substrate 100. The pixel electrode material layer 221*p* may be formed on the planarization layer 117 in the component area CA and may be formed on the conductive material layer BMLp in the transmission area TA. The pixel electrode material layer 221*p* may include a reflective layer including conductive oxide, such as ITO, IZO, ZnO, $In_2O_3$, IGO, and/or AZO, or Ag, Mg, Al, Pt, Pd, Au, Ni, Nd, Ir, Cr, or an alloy/combination of some of the metals.

Referring to FIG. 15C, after the pixel electrode material layer 221*p* is formed on the planarization layer 117, at least a portion of the pixel electrode material layer 221*p* may be removed to form the pixel electrode 221. The pixel electrode 221 may be formed by wet etching the at least the portion of the pixel electrode material layer 221*p*.

When the at least the portion of the pixel electrode material layer 221*p* is etched, at least a portion of the second conductive material layer 105*bp* corresponding to the transmission area TA may also be etched. The at least the portion of the second conductive material layer 105*bp* may be wet etched using the inorganic insulating layer IIL as an etch mask, and the upper conductive layer 105*b* (having the second opening 105*b*_OP corresponding to the opening IIL_OP of the inorganic insulating layer IIL) may be formed. A portion of an upper surface of the first conductive material layer 105*ap* may be exposed by the second opening 105*b*_OP.

Because the second opening 105*b*_OP may be formed using the inorganic insulating layer IIL as an etch mask, a planar shape of the second opening 105*b*_OP may substantially similar/identical to a planar shape of the opening IIL_OP of the inorganic insulating layer IIL. Thus, he second opening 105*b*_OP may have a substantially polygonal, oval, circular, or cross shape and may have an edge that includes convex and concave edge portions. The second opening 105*b*_OP may include convex edge portions that are convex toward outer edges (or an outer perimeter) of upper conductive layer 105*b*, wherein concave edge portions may be provided between the convex edge portions.

An undercut structure u may be formed in the upper conductive layer 105*b* due to isotropic etching, as described above with reference to FIG. 9.

Figure 15D:
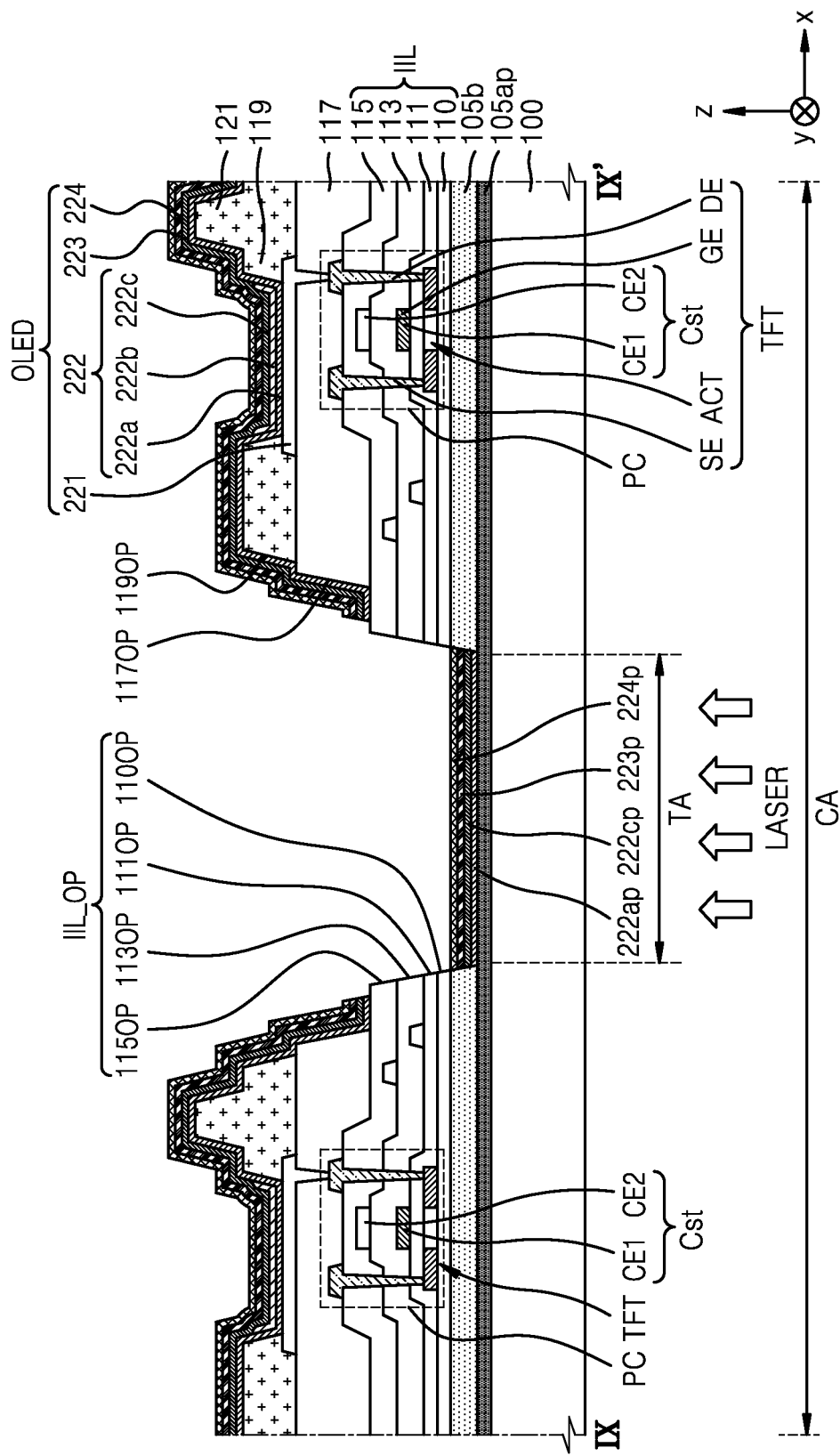

Referring to FIG. 15D, after the pixel electrode 221 and the upper conductive layer 105*b* are formed, the intermediate layer 222 (an organic material layer), the opposite electrode 223 (an electrode layer), and the capping layer 224 may be sequentially formed on the entire (upper) surface of the substrate 100 to cover the pixel electrode 221 and the upper conductive layer 105*b*.

The first functional layer 222*a* and the second functional layer 222*c* of the intermediate layer 222, the opposite electrode 223, and the capping layer 224 may be formed as one body to correspond to display elements. A portion 222*ap* of the first functional layer 222*a*, a portion 222*cp* of the second functional layer 222*c*, a portion 223*p* of the opposite electrode 223, and a portion 224*p* of the capping layer 224 may be formed on an exposed portion of an upper surface of the first conductive material layer 105*ap* at the transmission area TA.

In embodiments, materials included in the intermediate layer 222, the opposite electrode 223, and the capping layer 224 may be thinly deposited or may not be deposited on inner surfaces of the inorganic insulating layer IIL, the planarization layer 117, and the pixel-defining layer 119 and may be partially removed at the transmission area TA.

After the intermediate layer 222, the opposite electrode 223, and the capping layer 224 are formed, a laser beam may be (topically) irradiated onto a lower surface that is opposite an upper surface of the substrate 100 at a position corresponding to the transmission area TA. The laser beam may be irradiated to a position corresponding to the component area CA, and a laser mask may be used. An opening of the laser mask may expose the transmission area TA, and the laser mask may cover the component area CA.

If the first functional layer 222*a*, the second functional layer 222*c*, the opposite electrode 223, and the capping layer 224 remain on the transmission area TA, the transmittance of the transmission area TA may be significantly reduced. In order to improve the transmittance of the transmission area TA, the portion 222*ap* of the first functional layer 222*a*, the portion 222*cp* of the second functional layer 222*c*, the portion 223*p* of the opposite electrode 223, and the portion 224*p* of the capping layer 224 may be removed, for example, by a laser beam.

If a portion of the pixel electrode material layer remains on the transmission area TA and is used as a sacrificial layer, when the organic material layer, the electrode layer, and the capping layer are removed using a laser beam, a portion of the pixel electrode material may undesirably remain on a side wall portion of the transmission area TA. For example, if the pixel electrode material layer includes Ag, Ag particles may undesirably remain at the transmission area TA.

The conductive layer BML arranged below the pixel circuit PC may have a sufficient thickness to prevent the deterioration of the properties of the transistor due to light emitted from the component, etc. If portions of the organic material layer, the electrode layer, and the capping layer on the transmission area TA are removed via a laser lift off process using the conductive layer BML as a sacrificial layer, the thickness of the sacrificial layer may increase the laser irradiation time.

According to an embodiment, the conductive material layer BMLp may include the first conductive material layer 105*ap* formed of a first material and may include the second conductive material layer 105*bp* formed of a second material different from the first material. The portion 222*ap* of the first functional layer 222*a*, the portion 222*cp* of the second functional layer 222*c*, the portion 223*p* of the opposite electrode 223, and the portion 224*p* of the capping layer 224 may be removed using the first conductive material layer 105*ap* (thinner than the second conductive material layer 105*bp*) as the sacrificial layer. The lower conductive layer 105*a* (formed using the first conductive material layer 105*ap*) and the upper conductive layer 105*b* (formed using the second conductive material layer 105*bp*) may be arranged on a region of the component area CA outside the transmission area TA. The deterioration of the transistor of the component area CA, etc. may be substantially prevented by the lower conductive layer 105*a* and the upper conductive layer 105*b*, which have sufficient thicknesses.

Figure 15E:
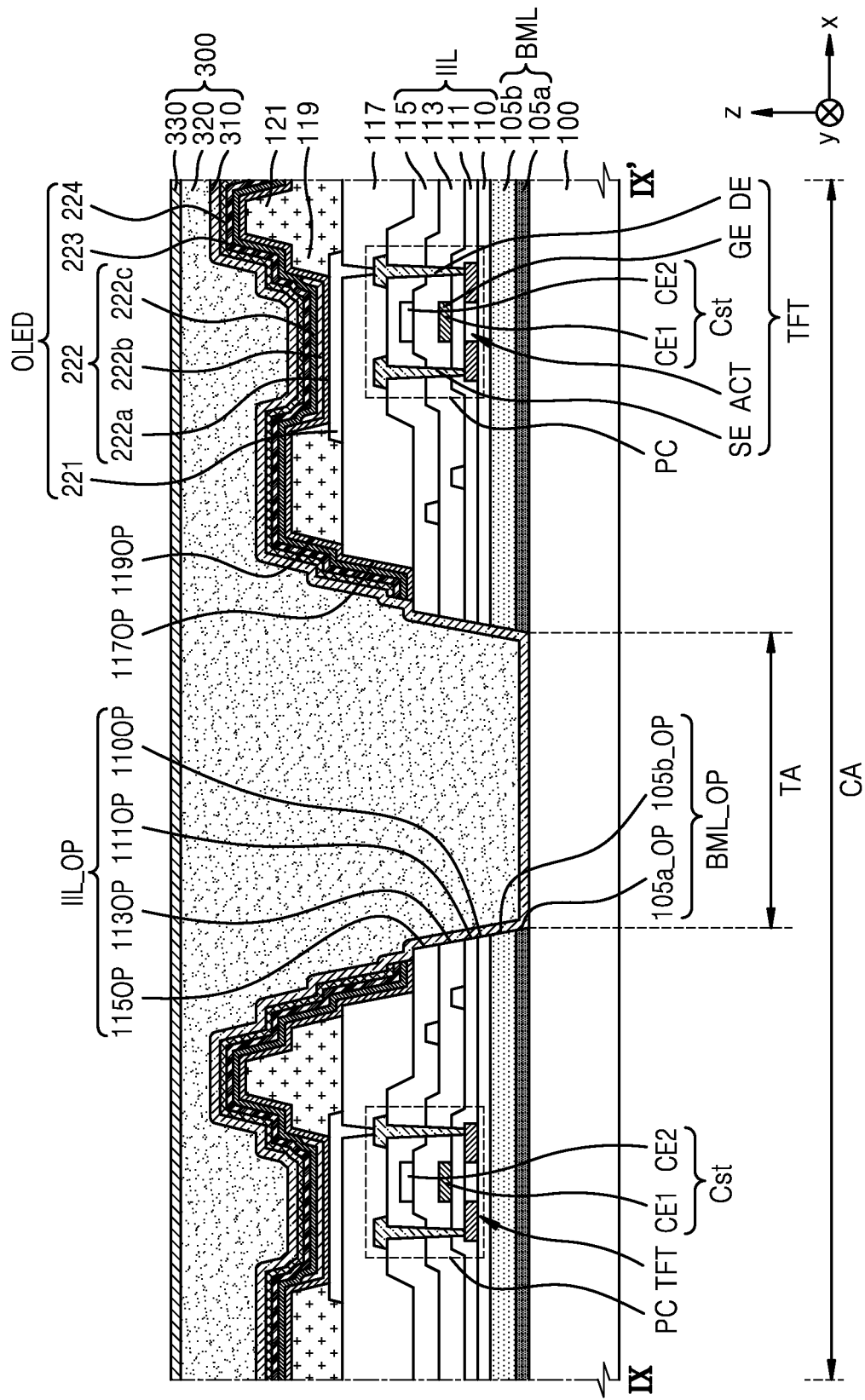

Referring to FIG. 15E, when the portion 222*ap* of the first functional layer 222*a*, the portion 222*cp* of the second functional layer 222*c*, the portion 223*p* of the opposite electrode 223, and the portion 224*p* of the capping layer 224 are removed through the laser lift off process, a portion of the first conductive material layer 105*ap* formed on the transmission area TA may also be removed. As a result, the lower conductive layer 105*a* having the first opening 105*a*_OP corresponding to the second opening 105*b*_OP may be formed. The first opening 105*a*_OP may have a substantially polygonal, oval, circular, or cross shape In a plan view and may have concave and convex edge portions. The first opening 105a_OP may include convex portions that are convex toward outer edges (or an outer perimeter) of the lower conductive layer 105a, wherein concave portions may be provided between the convex portions.

Because the portion 222ap of the first functional layer 222a, the portion 222cp of the second functional layer 222c, the portion 223p of the opposite electrode 223, and the portion 224p of the capping layer 224 may be removed, the transmittance of the transmission area TA may be improved.

After the portion 222ap of the first functional layer 222a, the portion 222cp of the second functional layer 222c, the portion 223p of the opposite electrode 223, and the portion 224p of the capping layer 224 are removed, the thin-film encapsulation layer 300 may be formed. The thin-film encapsulation layer 300 may include the first inorganic encapsulation layer 310, the second inorganic encapsulation layer 330, and the organic encapsulation layer 320 between the layers 310 and 330.

According to embodiments, high quality images may be provided by a display apparatus, diffraction of light received by components of a display apparatus may be substantially prevented, and/or defects of a display apparatus may be substantially prevented.

The embodiments described above should be considered in an illustrative sense and not for purposes of limitation. Descriptions of features or aspects within each embodiment may be applicable to other embodiments. While example embodiments have been described, various changes in form and details may be made in the example embodiments without departing from the scope defined by the following claims.

What is claimed is:

1. A display apparatus comprising:
    a substrate;
    display elements overlapping the substrate and spaced from each other;
    an insulating layer arranged between the substrate and the display elements, comprising a first protrusion, and comprising a first opening;
    a pixel-defining layer disposed on the insulating layer and including a hole defining an emission area; and
    a conductive layer arranged between the substrate and the insulating layer and comprising a second opening corresponding to the first opening,
    wherein the first opening is positioned between the display elements in a plan view of the display apparatus,
    wherein an edge of the first opening comprises first convex portions,
    wherein the first protrusion is positioned between two of the first convex portions and protrudes toward an inner part of the first opening,
    wherein the conductive layer comprises a first conductive layer and a second conductive layer overlapping the first conductive layer, and wherein the first conductive layer is positioned between the substrate and the second conductive layer,
    wherein the first conductive layer has a first thickness and the second conductive layer has a second thickness greater than the first thickness,
    wherein the second opening of the conductive layer extends through the first conductive layer and the second conductive layer and connects to the first opening of the insulation layer,
    wherein the first conductive layer is in direct contact with the second conductive layer in an entire area of a component area except the second opening,
    wherein the first conductive layer and the second conductive layer overlap the emission area, and
    wherein the second conductive layer comprises an undercut structure.

2. The display apparatus of claim 1, wherein each of the first convex portions is convex toward a perimeter of the insulating layer, and wherein the edge of the first opening further comprises a first concave portion positioned between the two of the first convex portions and corresponding to the first protrusion.

3. The display apparatus of claim 1, wherein the edge of the first opening further comprises:
    a first edge portion and a second edge portion spaced from each other in a first direction with a center of the first opening being positioned between the first edge portion and the second edge portion; and
    a third edge portion and a fourth edge portion spaced from each other in a second direction different from the first direction with the center of the first opening being positioned between the third edge portion and the fourth edge portion,
    wherein each of the first to fourth edge portions comprises the first convex portions.

4. The display apparatus of claim 3, wherein the edge of the first opening further comprises:
    a fifth edge portion having two ends respectively directly connected to the first edge portion and the third edge portion; and
    a sixth edge portion having two ends respectively directly connected to the first edge portion and the fourth edge portion,
    wherein each of the fifth and sixth edge portions comprises the first convex portions.

5. The display apparatus of claim 1, wherein an edge of the second opening comprises second convex portions, wherein the conductive layer comprises a second protrusion, and wherein the second protrusion is positioned between two of the second convex portions and protrudes toward an inner part of the second opening.

6. The display apparatus of claim 1, further comprising transistors at least partially overlapping the conductive layer and electrically connected to the display elements, respectively.

7. The display apparatus of claim 1, wherein the insulating layer comprises openings, and wherein the openings include the first opening and are arranged in a row direction and a column direction.

* * * * *